United States Patent
Odell et al.

(10) Patent No.: US 11,611,279 B2
(45) Date of Patent: *Mar. 21, 2023

(54) INPUT LINE VOLTAGE OPERATION FOR A POWER CONVERTER

(71) Applicant: Power Integrations, Inc., San Jose, CA (US)

(72) Inventors: Arthur B. Odell, Morgan Hill, CA (US); Rajko Duvnjak, Kanata (CA)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/168,431

(22) Filed: Feb. 5, 2021

(65) Prior Publication Data
US 2021/0167680 A1  Jun. 3, 2021

Related U.S. Application Data

(63) Continuation of application No. PCT/US2019/065912, filed on Dec. 12, 2019.
(Continued)

(51) Int. Cl.
*H02M 3/335* (2006.01)
*H02M 1/08* (2006.01)
(Continued)

(52) U.S. Cl.
CPC ....... *H02M 3/33507* (2013.01); *H02M 1/083* (2013.01); *H02M 1/342* (2021.05);
(Continued)

(58) Field of Classification Search
CPC ............. H02M 1/083; H02M 3/33576; H02M 1/0058; H02M 1/342; H02M 3/335;
(Continued)

(56) References Cited

U.S. PATENT DOCUMENTS 4,974,063 A * 11/1990 Kurihara ................. H04N 9/81
386/E9.056
5,402,329 A 3/1995 Wittenbreder
(Continued)

FOREIGN PATENT DOCUMENTS

CN 103795260 B 1/2016
CN 105978344 B 5/2018
(Continued)

OTHER PUBLICATIONS

Dalal, "Design Considerations for Active Clamp and Reset Technique," Unitrode Seminar Paper, 24 pages.
(Continued)

*Primary Examiner* — Yusef A Ahmed
(74) *Attorney, Agent, or Firm* — Power Integrations, Inc.; Karina Martha G. Li

(57) ABSTRACT

A controller configured for use in a power converter. The controller includes a control circuit coupled to receive an input line voltage sense signal representative of an input voltage of the power converter. The control circuit is configured to generate a control signal in response to a request signal representative of an output of the power converter. The control signal represents a delay time to turn on a power switch after a turn on of a clamp switch in response to the input line voltage sense signal. The control circuit can further generate a clamp drive signal to control a clamp driver and a drive circuit configured to generate a drive signal to control the power switch to transfer energy from an input of the power converter to the output of the power converter.

19 Claims, 11 Drawing Sheets

Related U.S. Application Data

(60) Provisional application No. 62/838,227, filed on Apr. 24, 2019.

(51) Int. Cl.
  *H03K 3/037* (2006.01)
  *H02M 1/34* (2007.01)
  *H02M 1/00* (2006.01)

(52) U.S. Cl.
  CPC ........ *H02M 3/33576* (2013.01); *H03K 3/037* (2013.01); *H02M 1/0058* (2021.05); *H02M 1/34* (2013.01)

(58) Field of Classification Search
  CPC ......... H02M 3/33507; H02M 3/33523; H02M 1/34; H03K 3/037; Y02B 70/10
  See application file for complete search history.

(56) References Cited

U.S. PATENT DOCUMENTS

| | | | |
|---|---|---|---|
| 5,430,633 A * | 7/1995 | Smith | H02M 3/33569 363/20 |
| 5,602,724 A | 2/1997 | Balakrishnan | |
| 5,818,707 A * | 10/1998 | Seong | H02M 1/4225 323/210 |
| 5,841,641 A * | 11/1998 | Faulk | H02M 3/335 363/80 |
| 5,991,172 A * | 11/1999 | Jovanovic | H02M 1/4258 363/21.14 |
| 6,061,257 A * | 5/2000 | Spampinato | H02M 3/33523 363/21.13 |
| 6,069,807 A * | 5/2000 | Boylan | H02M 3/33507 363/16 |
| 6,144,564 A | 11/2000 | Fraidlin et al. | |
| 6,496,392 B2 | 12/2002 | Odell | |
| 7,116,090 B1 * | 10/2006 | Yang | H02M 1/4225 323/284 |
| 7,471,530 B2 * | 12/2008 | Balakrishnan | H02M 3/33507 363/95 |
| 7,518,885 B2 | 4/2009 | Baurle et al. | |
| 7,719,248 B1 | 5/2010 | Melanson | |
| 7,995,360 B2 | 8/2011 | Mayell | |
| 8,077,483 B2 | 12/2011 | Djenguerian et al. | |
| 8,125,805 B1 | 2/2012 | Melanson | |
| 8,154,889 B1 | 4/2012 | Hong | |
| 8,179,110 B2 | 5/2012 | Melanson | |
| 8,400,789 B2 | 3/2013 | Joshi | |
| 8,427,848 B2 | 4/2013 | Lund | |
| 8,451,630 B2 | 5/2013 | Nania et al. | |
| 8,598,921 B2 | 12/2013 | Thalheim et al. | |
| 8,693,217 B2 | 4/2014 | Mao | |
| 8,742,744 B2 | 6/2014 | Abu Qahouq | |
| 9,019,728 B2 | 4/2015 | Matthews et al. | |
| 9,276,477 B2 | 3/2016 | Thomas et al. | |
| 9,444,357 B1 * | 9/2016 | Matthews | H02M 3/3353 |
| 9,584,017 B1 * | 2/2017 | Sundararaj | H02M 3/156 |
| 9,673,718 B2 | 6/2017 | Fahlenkamp et al. | |
| 9,680,382 B2 * | 6/2017 | Vaughan | G01R 23/02 |
| 9,742,288 B2 | 8/2017 | Balakrishnan et al. | |
| 9,743,468 B2 | 8/2017 | Strijker et al. | |
| 9,871,510 B1 | 1/2018 | Horwitz et al. | |
| 9,973,098 B2 | 5/2018 | Phadke et al. | |
| 10,186,976 B2 | 1/2019 | Duvnjak | |
| 10,291,134 B2 | 5/2019 | Radic | |
| 10,291,136 B2 * | 5/2019 | Song | H02M 3/33569 |
| 10,554,134 B2 | 2/2020 | Werner et al. | |
| 10,554,136 B1 | 2/2020 | Miletic | |
| 10,587,186 B2 | 3/2020 | Espino | |
| 10,651,746 B2 * | 5/2020 | Song | H02M 3/33592 |
| 10,651,754 B1 * | 5/2020 | Murugesan | H02M 3/33523 |
| 10,826,398 B2 | 11/2020 | Wang et al. | |
| 10,868,473 B2 * | 12/2020 | Chang | H02M 1/08 |
| 10,965,218 B1 * | 3/2021 | Odell | H02M 1/34 |
| 10,971,990 B1 * | 4/2021 | Rajesh | H02M 3/33523 |
| 11,088,628 B2 * | 8/2021 | Hyugaji | H02M 3/33576 |
| 11,152,867 B2 * | 10/2021 | Chopra | H02M 3/33569 |
| 11,251,704 B2 | 2/2022 | Wu et al. | |
| 2003/0231011 A1 * | 12/2003 | Umemoto | H02M 1/38 323/284 |
| 2005/0046404 A1 * | 3/2005 | Uusitalo | H02M 3/33569 323/285 |
| 2005/0201128 A1 * | 9/2005 | Jin | H02M 1/34 363/56.01 |
| 2006/0215424 A1 * | 9/2006 | Aso | H02M 3/33507 363/21.01 |
| 2006/0256588 A1 * | 11/2006 | Chen | G05F 1/70 363/55 |
| 2007/0007938 A1 * | 1/2007 | Djenguerian | H02M 3/33507 323/284 |
| 2008/0284398 A1 * | 11/2008 | Qiu | H02M 3/156 323/283 |
| 2010/0067259 A1 * | 3/2010 | Liu | H02M 3/33569 363/21.01 |
| 2010/0194445 A1 * | 8/2010 | Balakrishnan | H02M 3/33507 327/108 |
| 2010/0284204 A1 | 11/2010 | Mayell | |
| 2011/0148379 A1 * | 6/2011 | Gu | H02M 3/156 323/284 |
| 2011/0193494 A1 * | 8/2011 | Gaknoki | H05B 45/382 315/307 |
| 2011/0194312 A1 * | 8/2011 | Gaknoki | H02M 1/083 363/21.12 |
| 2011/0254537 A1 | 10/2011 | Yang et al. | |
| 2011/0305048 A1 | 12/2011 | Yang et al. | |
| 2012/0032657 A1 | 2/2012 | Dequina | |
| 2012/0049823 A1 * | 3/2012 | Chen | H02M 3/157 323/282 |
| 2012/0212204 A1 * | 8/2012 | Philbrick | H02M 3/156 323/284 |
| 2012/0299561 A1 * | 11/2012 | Chen | H02M 3/33507 323/284 |
| 2013/0010502 A1 * | 1/2013 | Chen | H02M 3/3387 363/21.02 |
| 2013/0027990 A1 * | 1/2013 | Baurle | H02M 3/33507 363/21.17 |
| 2013/0057323 A1 * | 3/2013 | Spini | H02M 3/33553 327/142 |
| 2014/0078787 A1 * | 3/2014 | Sonobe | H02M 3/3376 363/21.02 |
| 2014/0204625 A1 * | 7/2014 | Liu | H02M 1/08 363/21.13 |
| 2014/0307484 A1 * | 10/2014 | Yang | H02M 3/33569 363/21.12 |
| 2015/0003121 A1 * | 1/2015 | Yang | H02M 3/33523 363/21.17 |
| 2015/0137776 A1 | 5/2015 | Thomas et al. | |
| 2016/0181929 A1 * | 6/2016 | Chen | H02M 1/08 363/21.18 |
| 2016/0268909 A1 * | 9/2016 | Liu | H02M 1/14 |
| 2016/0301314 A1 * | 10/2016 | Polivka | H02M 3/33507 |
| 2016/0365801 A1 * | 12/2016 | Phadke | H02M 1/34 |
| 2017/0012529 A1 * | 1/2017 | Yamada | H02M 3/158 |
| 2017/0070152 A1 * | 3/2017 | Liu | H02M 3/33569 |
| 2017/0222569 A1 * | 8/2017 | Choi | H02M 3/33592 |
| 2017/0264206 A1 * | 9/2017 | Rana | H02M 1/083 |
| 2017/0373604 A1 * | 12/2017 | Chen | H02M 1/36 |
| 2018/0006015 A1 | 1/2018 | Rutter et al. | |
| 2018/0013352 A1 * | 1/2018 | Cao | H02M 3/33592 |
| 2018/0131286 A1 * | 5/2018 | Song | H02M 3/33538 |
| 2018/0294731 A1 * | 10/2018 | Song | H02M 3/33523 |
| 2018/0294734 A1 * | 10/2018 | Song | H02M 3/33592 |
| 2018/0294735 A1 * | 10/2018 | Song | H02M 1/083 |
| 2018/0309442 A1 | 10/2018 | Siebler | |
| 2018/0358902 A1 * | 12/2018 | Duvnjak | H02M 3/33592 |
| 2019/0044448 A1 * | 2/2019 | Balakrishnan | H02M 3/33592 |
| 2019/0334431 A1 * | 10/2019 | Spohn | H02M 7/12 |
| 2019/0341859 A1 * | 11/2019 | Cohen | H02M 1/34 |
| 2020/0021284 A1 | 1/2020 | Thalheim | |
| 2020/0036293 A1 * | 1/2020 | Kannan | H02M 3/33523 |
| 2020/0195124 A1 * | 6/2020 | Mayell | H02M 3/3376 |

(56) References Cited

U.S. PATENT DOCUMENTS

| | | | | |
|---|---|---|---|---|
| 2020/0395857 | A1* | 12/2020 | Hwang | H02M 1/083 |
| 2021/0021199 | A1* | 1/2021 | Liu | H02M 3/33569 |
| 2021/0058002 | A1* | 2/2021 | Wong | H02M 3/33569 |
| 2021/0184556 | A1* | 6/2021 | Deng | H02M 1/0058 |
| 2021/0194378 | A1* | 6/2021 | Tian | H02M 3/33592 |
| 2021/0257923 | A1* | 8/2021 | Odell | H02M 1/0006 |
| 2021/0281184 | A1* | 9/2021 | Radic | H02M 1/0058 |
| 2022/0006393 | A1* | 1/2022 | Wong | H02M 1/083 |
| 2022/0069718 | A1* | 3/2022 | Xu | H02M 3/33569 |

FOREIGN PATENT DOCUMENTS

| | | |
|---|---|---|
| EP | 1750137 A2 | 2/2007 |
| EP | 3107199 A1 | 12/2016 |
| EP | 3210293 A1 | 8/2017 |
| EP | 3849082 A1 | 7/2021 |
| WO | 2007072075 A2 | 6/2007 |
| WO | 2017095408 A1 | 6/2017 |
| WO | 2021194838 A1 | 9/2021 |

OTHER PUBLICATIONS

Jailyn et al., "Analysis of Active Clamp Fly Back Converter," Modern Applied Science, vol. 9 No. 1, 2015, pp. 12-24, Canadian Center of Science and Education.

King et al., "Incorporating Active-Clamp Technology to MAximuze Efficiency in Flyback and Forward Designs," 2010 Texas Instruments Power Supply Design Seminar, SEM1900 Topic 2, SLUP262, 2010, 26 pages.

PCT Application No. PCT/US2019/065912; "Notification of Transmittal of the International Search Report and The Written Opinion of the International Searching Authority, or the Declaration"; dated Apr. 9, 2020; 18 pages.

Watson et al., "Characterization of an Active Clamp Flyback Topology for Power Factor Correction Applications," IEEE Transactions on Power Electronics, vol. 11 No. 1, Jan. 1996, pp. 191-198.

Alou et al., "Flyback with Active Clamp: a suitable topology for Low Power and Very Wide Input Voltage Range applications," 2002, IEEE, pp. 242-248.

Zhang et al., "A High Efficiency Flyback Converter with New Active Clamp Technique," IEEE Transactions on Power Electronics, vol. 25 No. 7, Jul. 2010, pp. 1775-1785.

Song, et al., "Comparison between Control Methods of Active Clamp Flyback for Adaptor Application," 2018 IEEE International Power Electronics and Application Conference and Exposition (PEAC), Shenzhen, China, 2018, pp. 1-6, 2018.

Park Jeongpyo et al: A CCM/DCM Dual-Mode Synchronous Rectification Controller for a High-Efficiency Flyback Converter, IEEE Transactions On Power Electronics, Institute of Electrical and Electronics Engineers, vol. 29, No. 2, 7 pages.

PCT Application No. PCT/US2021/022100; International Search Report and Written Opinion of the International Searching Authority; dated Oct. 5, 2021; 30 pages.

Texas Instruments: "UCC28780 High Frequency Active Clamp Flyback Controller", Feb. 28, 2018, 68 pages.

US Publication 2021/0167680 to Odell et al., 2021/0167680 is the publication of U.S. Appl. No. 17/168,431, which is the current matter, and the publication 2021/0167680 has not been included in the accompanying SB08.

U.S. Appl. No. 17/193,402, Non-Final Office Action dated Mar. 25, 2022, 27 pages.

\* cited by examiner

INPUT LINE VOLTAGE OPERATION FOR A POWER CONVERTER

CROSS-REFERENCE TO RELATED APPLICATIONS

This application is a continuation of International Patent Application No. PCT/US2019/065912, filed Dec. 12, 2019, which claims the benefit of U.S. Provisional Application No. 62/838,227 filed on Apr. 24, 2019. International Patent Application No. PCT/US2019/065912 and U.S. Provisional Application No. 62/838,227 are hereby incorporated by reference in their entirety.

BACKGROUND INFORMATION

Field of the Disclosure

The present invention relates generally to power converters, and more specifically zero voltage switching (ZVS) for variable frequency flyback power converters.

Background

Electronic devices (such as cell phones, tablets, laptops, etc.) use power to operate. Switched mode power supplies are commonly used due to their high efficiency, small size, and low weight to power many of today's electronics. Conventional wall sockets provide a high voltage alternating current. In a switching power supply, a high voltage alternating current (ac) input is converted with switched mode power converters to provide a well-regulated direct current (dc) output through an energy transfer element to a load. In operation, a switch is turned ON and OFF to provide the desired output by varying the duty cycle (typically the ratio of the on time of the switch to the total switching period), varying the switching frequency, or varying the number of on/off pulses per unit time of the switch in a switched mode power converter.

In a power converter such as a flyback converters when a primary power switch is turned off, the path for the current on the primary side is interrupted abruptly. The energy stored in the magnetizing energy of an energy transfer element can be transferred to the output but the energy in the leakage inductance cannot be transferred to the output. The stored energy is transferred to the drain to source capacitance of the main power switch. This can have catastrophic effects on the device as the voltage developed across the drain to source can exceed the device rating. Traditional flyback converters use passive clamps, e.g. RCD clamp where the leakage energy is captured in a clamp capacitor and the energy is burned in a resistor. This wasted energy reduces the overall efficiency of the system.

Active clamp strategies have been proposed that recycles the leakage energy to achieve zero voltage switching on the primary switch. This increases the efficiency of the overall system. The ZVS technique most commonly used today uses an active clamp on the primary side and a resonant LC secondary output winding structure. While this method has excellent efficiency and reliable ZVS operation the controller needs to be operated in burst mode. Burst mode is a complex control strategy which requires careful optimization of the loop speed and stability of the system. This can be particularly challenging from adapters where the output voltage can vary over a wide range (e.g. USBPD).

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
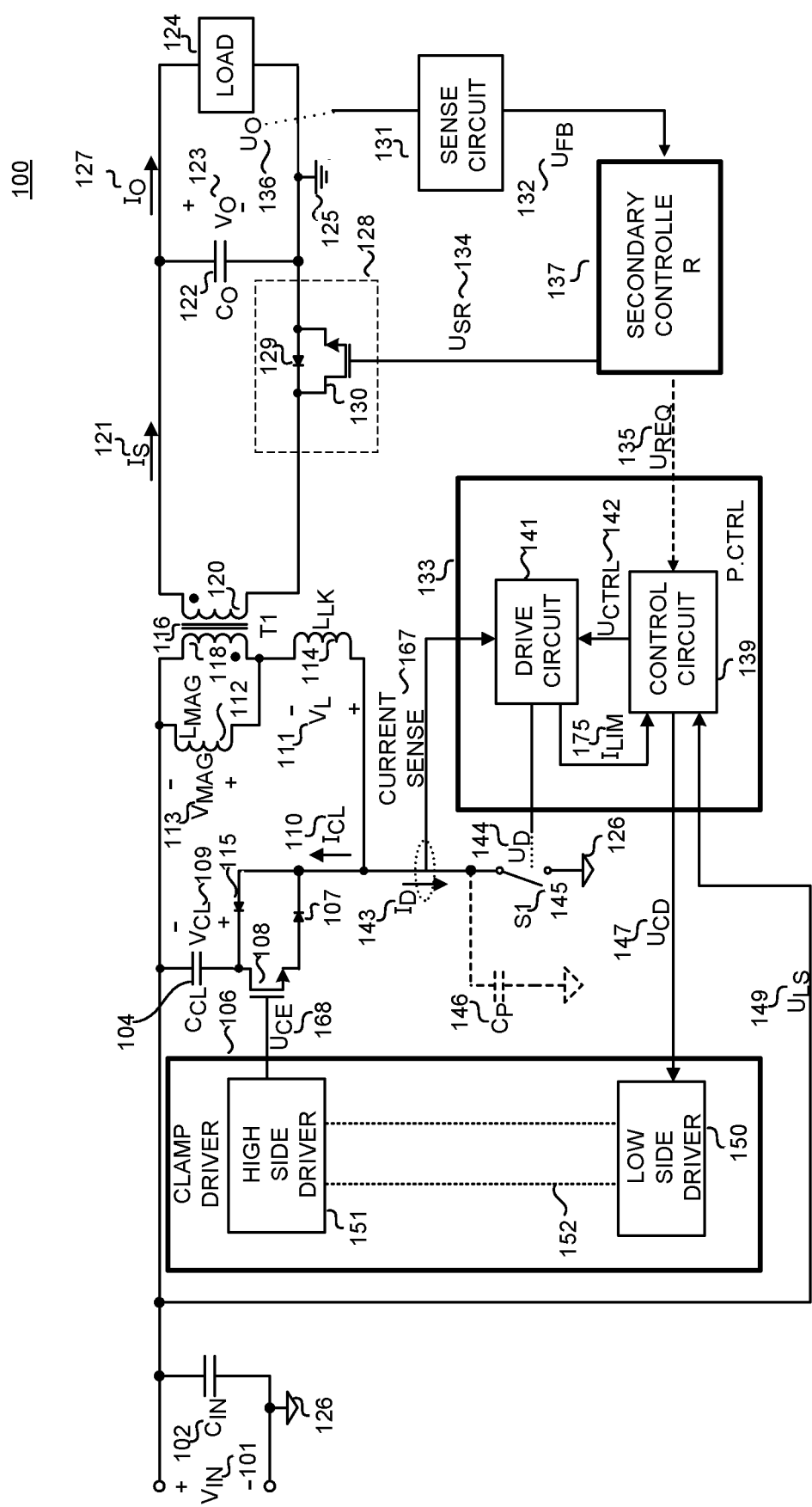
FIG. 1 illustrates one example of a power converter with a primary controller, a secondary controller, and a clamp driver, in accordance with embodiments of the present disclosure

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of a power converter that can transition from a discontinuous conduction mode of operation to a continuous conduction mode of operation in response to a line input voltage are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment," "an embodiment," "one example," or "an example" means that a particular feature, structure or characteristic described in connection with the embodiment or example is included in at least one embodiment of the present invention. Thus, appearances of the phrases "in one embodiment," "in an embodiment," "one example," or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

A power converter such as a flyback converter can provide low output currents at low component cost and is relatively simple in comparison to other converter topologies. The flyback converter may also utilize an active clamp circuit to prevent excess voltage from damaging components within the flyback converter.

Conduction losses and switching losses occur due to the electrical resistance in the circuit and the parasitic capacitance that is switched by the power converter, particularly when the power switch is a transistor. When the power switch conducts current, the resistance of the circuit along with the current passing in the circuit generates conduction loss. Switching losses are generally associated with the losses, which occur while the power switch of the power converter is transitioning between an ON state and an OFF state or vice versa. In one example, a switch that is ON (or closed) may conduct current while a switch that is OFF (or open) cannot conduct current. When the power switch is open, voltage across the switch stores energy in the parasitic capacitance. The parasitic capacitance discharges when the power switch closes, dissipating the energy stored in the parasitic capacitance in the resistance of the power switch to produce switching loss. Further, switching losses may result from having a non-zero voltage across the power switch at the moment the power switch turns ON or from having a non-zero current through the power switch when the power switch turns OFF. The active clamp circuit may be used to reduce the switching losses through the use of zero voltage switching techniques.

For a power converter to maintain high efficiency in light load or no load conditions, a power converter controller may implement a burst mode operation by turning on and turning off the power switch for an interval of time (also referred to as a burst interval) followed by an interval of no switching. For flyback converters with an active clamp, it can be difficult to optimize loop speed and stability and ripple for wide output voltage ranges or designs that require stable constant current (CC) operation. To avoid the complexity of burst mode, the disclosure shows a power converter controller that controls an active clamp and a flyback converter that provides a continuous variable frequency for zero voltage switch (ZVS) without the necessity of burst mode or the complexity of a LC output winding network. The variable frequency can easily be controlled for optimal loop response for output response and line rejection. In addition, the power converter controller can determine whether to operate in a discontinuous conduction mode (DCM) and continuous conduction mode (CCM) in response to a line sense input voltage representative of the input line voltage. In one example, when operating in CCM at lower input voltages, the root mean square (RMS) currents of the power switch is reduced which improves the efficiency of the power converter.

To illustrate, FIG. 1 shows a block diagram of an example power converter 100 including a clamp driver 106, a primary controller 133, and a secondary controller 137 in accordance with the teachings of the present disclosure. The illustrated example of the power converter 100 includes an input capacitor $C_{IN}$ 102, an energy transfer element 116, a primary winding 118 of the energy transfer element 116, a secondary winding 120 of the energy transfer element 116, a power switch S1 145, a clamp capacitor $C_{CL}$ 104, diodes 107 and 115, a clamp switch 108, an output capacitor $C_O$ 122, an input return 126, an output return 125, a synchronous rectifier 128, and a sense circuit 131.

The clamp driver 106 is shown including a low side driver 150 and a high side driver 151. The low side driver 150 is configured to control the high side driver through the communication link 152. The high side driver is configured to generate a clamp enable signal $U_{CE}$ 168 to control the clamp switch 108.

The secondary controller 137 is configured to generate a secondary drive signal 134 to control the synchronous rectifier 128, and a request signal $U_{REQ}$ 135. The request signal $U_{REQ}$ 135 is communicated to the primary controller to enable the power switch S1 145. Furthermore, the secondary controller 137 is coupled to receive a feedback signal $U_{FB}$ 132 representative of an output of the power converter 100.

The primary controller 133 is shown comprising a control circuit 139 and a drive circuit 141. The control circuit 139 is coupled to receive the request signal $U_{REQ}$ 135 from the secondary controller 137 and a current sense signal representative of the switch current $I_D$ 143 of the power switch. The control circuit 139 is configured to generate a control signal $U_{CTRL}$ 142 in response to the input line voltage sense signal $U_{LS}$ 149. The control signal $U_{CTRL}$ 142 represents a delay time to turn on the power switch S1 145 after a turn of the clamp switch 108. The input line voltage sense signal $U_{LS}$ 149 is representative of an input voltage $V_{IN}$ 101 of the power converter 100. As will be further explained, the delay time of the control signal $U_{CTRL}$ 142 is selected in response to the input line voltage sense signal $U_{LS}$ 149. The drive circuit 141 is coupled to receive the control signal $U_{CTRL}$ 142 and generate a drive signal $U_D$ 144 to control the power switch 145. The drive circuit 141 is further coupled to receive a current sense signal representative of a switch current $I_D$ 143 of the power switch 145. The drive circuit 141 is coupled to turn on the power switch S1 145, and coupled to turn off the power switch S1 145 in response to the switch current $I_D$ 143 reaching the current limit (not shown).

Further illustrated is a magnetizing inductance $L_{MAG}$ 112, a leakage inductance LLK 114, which may represent the magnetizing and leakage inductance associated with the energy transfer element 116 or a discrete inductor. In dashed lines, a parasitic capacitance $C_P$ 146 is shown to represent all the capacitance that couples to the power switch S1 145 and may include natural capacitance internal to the energy transfer element 116, the natural internal capacitance of power switch S1 145 and/or discrete capacitors. Also shown in FIG. 1 are a secondary current $I_S$ 121, an output voltage $V_O$ 123, an output current $I_O$ 127, an output quantity $U_O$ 136, a feedback signal $U_{FB}$ 132, a clamp voltage $V_{CL}$ 109, clamp current $I_{CL}$ 110, and a leakage voltage $V_L$ 111. In the illustrated example, the power converter 100 is shown as having a flyback topology. It is appreciated that other known topologies and configurations of power converters may also benefit from the teachings of the present disclosure.

The power converter 100 provides output power to a load 124 from an unregulated input voltage $V_{IN}$ 101. In one embodiment, the input voltage $V_{IN}$ 101 is a rectified and filtered ac line voltage. In another embodiment, the input voltage $V_{IN}$ 101 is a dc input voltage. The energy transfer element 116 is coupled to receive the input voltage $V_{IN}$ 102. In some embodiments, the energy transfer element 116 may be a coupled inductor, transformer, or an inductor. The example energy transfer element 116 is shown as including two windings, a primary winding 118 (with Np number of turns) and secondary winding 120 (with Ns number of turns). However, the energy transfer element 116 may have more than two windings. The voltage across the primary winding 118 is illustrated as the primary voltage with the positive polarity at the dot end of the primary winding 118. When the power switch S1 145 is ON, the primary voltage is substantially equal to the negative sum of the input voltage $V_{IN}$ 102 and the leakage voltage $V_L$ 1135, or mathematically: $V_P = -(V_{IN} + V_L)$. When the power switch S1 145 is OFF, the primary voltage is substantially equal to the reflected output voltage of the secondary winding 120. The primary winding 118 of the energy transfer element is further coupled to the power switch S1 145 and the power switch S1 145 is further coupled to input return 126.

In operation, the primary controller 133 determines a first mode of operation in response to the input line voltage sense signal $U_{LS}$ 149. The first mode of operation occurs when the input line voltage sense signal $U_{LS}$ 149 is less than a CCM threshold. In one example, the CCM threshold can be in the range of 130 volts. When the power switch S1 145 is turned off, after being turned on, the drain-source voltage rises at a rate that is determined by the peak current at turn-off of power switch and the capacitance CP 146. The drain to source voltage will continue to rise until clamped to the clamp voltage $V_{CL}$ 109 of the clamp capacitor $C_{CL}$ 106 through diode 115 Prior to the turn on of the power switch S1 145, the clamp switch 108 is turned on by the clamp driver 106. The leakage inductance $L_{LK}$ 114 and the primary winding 118 is charged by the clamp capacitor voltage across $C_{CL}$ 104 through the clamp switch 108 in the on state. When the clamp switch 108 is turned on, voltage is applied to the leakage inductance $L_{LK}$ 114 which causes current to rise through in the opposite direction of when the power switch S1 145 was on. After a specified time, clamp switch 108 is turned off. The turn off of the clamp switch 108 causes the drain to source voltage of the power switch S1 145 to fall substantially to zero. During that time, the leakage and energy that had been charged by the clamp switch 108 being on is discharged. After the drain voltage has reach substantially to zero volts the power switch S1 145 can be turned on.

Furthermore, the primary controller 133 can determine a second mode of operation in response to the input line voltage sense signal $U_{LS}$ 149. The second mode of operation occurs when the input line voltage sense signal $U_{LS}$ 149 is greater than a DCM threshold. In one example the DCM threshold is in the range of 150 volts.

When the power switch S1 145 is turned off, after being turned on, the drain-source voltage rises at a rate that is determined by the peak current at turn-off of power switch S1 145 and the capacitance $C_P$ 146. The drain to source voltage will continue to rise until clamped to the clamp voltage $V_{CL}$ 109 through diode 115. Prior to the turn on of the power switch S1 145, the clamp switch 108 is turned on by the clamp driver 106. When the clamp switch 108 is turned on, voltage is applied to the leakage inductance $L_{LK}$ 114 and the magnetizing inductance $L_{MAG}$ 112 which causes current to rise through in the opposite direction as compared to when the power switch S1 145 was on. After a specified time, clamp switch 108 is turned off. The turn off clamp switch causes the drain to source voltage of power switch S1 145 to fall substantially to zero. During that time the leakage and magnetizing energy that had been charged by the clamp switch 108 being on is discharged. This causes the voltage across drain to source of the power switch S1 145 to decrease and eventually reach zero. This mode typically takes longer to reach zero volts on the drain of the power switch S1 145 which is accommodated by second mode of operation by increasing the delay between clamp switch 108 turning off and the power switch S1 145 turning on. After the drain voltage has reach substantially to zero volts the main switch is turned on.

As shown, the leakage inductance $L_{LK}$ 114 may be coupled between the power switch S1 145 and the primary winding 118. The leakage inductance $L_{LK}$ 114 which may represent the leakage inductance associated with the energy transfer element 116 or a discrete inductor. The voltage across the uncoupled leakage inductance $L_{LK}$ 114 may be denoted as the leakage voltage $V_L$ 111.

Coupled across the primary winding 118 and the leakage inductance $L_{LK}$ 114 is the clamp switch 108. The clamp driver 106 is coupled to the clamp capacitance $C_{CL}$ 104. The voltage across the clamp capacitance CCL 104 is denoted as the clamp voltage $V_{CL}$ 109 while the current in the clamp circuit is denoted as clamp current $I_{CL}$ 110. The clamp switch 108 limits the maximum voltage on the power switch S1 145 and control of the clamp switch 108 (generated by the clamp driver 106) facilitates zero voltage switching of the power switch S1 145. In addition, the clamp driver 106 in conjunction with the clamp switch 108 may reduce RMS current in the power converter 100. Specifically, the clamp drive signal $U_{CD}$ 147 is received at a high side driver 151 which drives the clamp switch 108 (illustrated as a transistor). The clamp switch 108 is controlled to turn ON to inject current into the primary winding 118. The clamp switch 108 is turned ON for a first duration prior to the power switch S1 145 turning ON. In other words, the clamp switch 108 is not turned ON for the entire duration that the power switch S1 145 is turned off. At or near the beginning of the OFF time of the power switch S1 145, the clamp switch 108 conducts the charge associated with the leakage inductance $L_{LK}$ 114 of the power converter 100. This charge from the uncoupled leakage inductance $L_{LK}$ 114 is transferred to the clamp capacitance $C_{CL}$ 104 through the diode 115 and is stored. The diode 115 stops conducting substantially after the net charge associated with leakage inductance $L_{LK}$ 114 of the power converter 100 has been transferred. The clamp switch 108 remains OFF until near the end of the OFF time of the power switch S1 145. Once it is determined that the power switch should turn ON, the clamp switch 108 is turned on for a first duration of time. The transistor of the clamp switch 108 is turned on such that the net charge previously transferred to the clamp capacitance $C_{CL}$ 104 associated with the leakage inductance $L_{LK}$ 114 is transferred to the primary winding 118. As such, the energy associated with the leakage inductance $L_{LK}$ 114 is returned to the system rather than being dissipated. In one example, the leakage inductance $L_{LK}$ 114 represents the leakage inductance of the energy transfer element 116. The clamp switch 108 is controlled such that the leakage energy is reset and returned to the power converter rather than being dissipated.

Secondary winding 120 is coupled to the synchronous rectifier 128. The current outputted from the secondary winding 120 is illustrated as secondary current $I_S$ 121. Output capacitor $C_O$ 122 is shown as being coupled to the synchronous rectifier 128 and the output return 125. The power converter 100 further includes circuitry to regulate the output, which is exemplified as output quantity $U_O$ 136. In general, the output quantity $U_O$ 136 can be an output voltage $V_O$ 123, and output current $I_O$ 127, or a combination of the two. A sense circuit 131 is coupled to sense the output quantity $U_O$ 136 and to provide the feedback signal $U_{FB}$ 132, which is representative of the output quantity $U_O$ 136.

As shown, the secondary controller 137 is coupled to receive the feedback signal $U_{FB}$ 132 and generate a request signal $U_{REQ}$ 135 when the feedback signal $U_{FB}$ 132 is below a regulation threshold. The request signal $U_{REQ}$ 135 is transmitted to the primary controller 133 through a communication link to enable the power switch S1 145. In one example, the primary controller 133 and the secondary controller 137 are galvanically isolated from each other. The communication link can be a magnetic coupling or an optical coupling.

The primary controller 133 is coupled to receive the current sense signal 167 and generates the drive signal $U_D$ 144 and the clamp enable signal $U_{CE}$ 147. The current sense signal 167 may be representative of the switch current $I_D$ 143 which is received by the power switch S1 145 and may be a voltage signal or a current signal. In addition, the primary controller 133 provides a drive signal $U_D$ 144 to the power switch S1 145 to control various switching parameters to control the transfer of energy from the input of power converter 100 through the energy transfer element 116 to the output of power converter 100. Examples of such parameters may include switching frequency (or period), duty cycle, ON and OFF times of the power switch S1 145, or varying the number of pulses per unit time of the power switch S1 145. In addition, the power switch S1 145 may be controlled such that it has a fixed switching frequency or a variable switching frequency. In one example of variable switching frequency control, the switching frequency may be reduced for light-load or no-load conditions. Previously, it was difficult to achieve zero voltage switching (ZVS) for flyback converters at lower switching frequencies with conventional active clamp techniques where the clamp circuit is turned on for the entire off-time of the power switch.

Power switch S1 145 is opened and closed in response to the drive signal $U_D$ 144. In operation, the switching of the power switch S1 145 produces a pulsating secondary current $I_S$ 121 which is filtered by the output capacitor $C_O$ 122 to produce a substantially constant output voltage $V_O$ 123, output current $I_O$ 127, or a combination of the two. In one example, the power switch S1 145 may be a transistor such as a metal-oxide-semiconductor field-effect transistor (MOSFET). In another example, the power switch S1 145 may comprise a cascode configuration such that a low voltage transistor is coupled to a high voltage junction field effect transistor (JFET). In one example, the JFET may comprise of gallium nitride (GaN) or silicon carbide (SiC) material. The primary controller 133, secondary controller 137, and power switch 145 may be implemented as a monolithic integrated circuit or may be implemented with discrete electrical components or a combination of discrete and integrated components.

Figure 2:
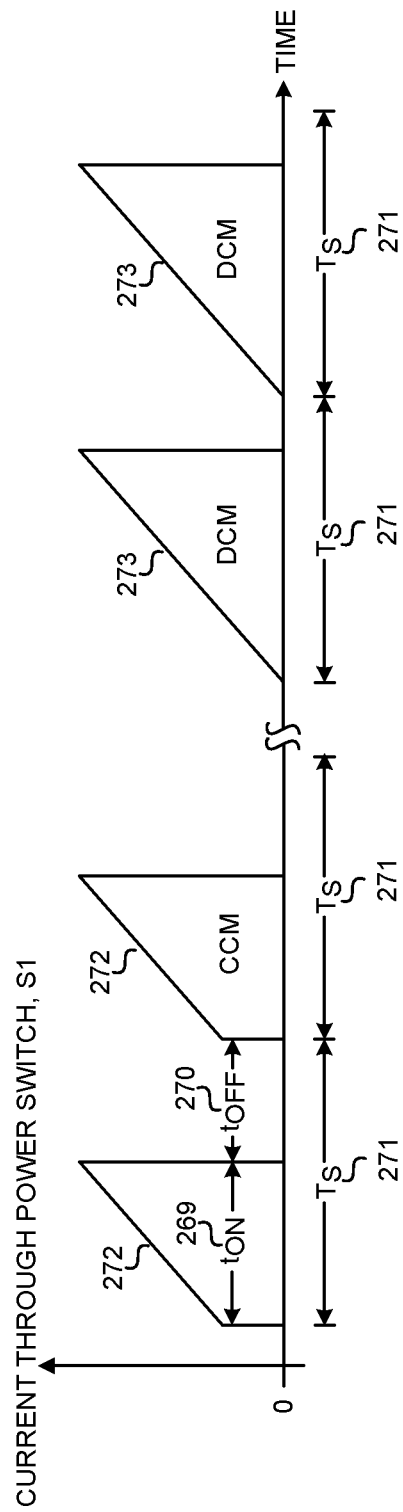
FIG. 2 illustrates one example of a timing diagram that illustrates a current of a power switch used in the power converter of FIG. 1, in accordance with embodiments of the present disclosure.

FIG. 2 illustrates a diagram of current through the power switch S1 145 of FIG. 1 for various modes of control including a switch on-time $t_{ON}$ 269, switch off-time $t_{OFF}$ 270, a switching period $T_S$ 271, a trapezoidal shape 272, and triangular shape 273. FIG. 2 illustrates the general waveforms of the current through the power switch S1 145 over time in both continuous conduction mode (CCM) and discontinuous conduction mode (DCM).

During any switching period $T_S$ 271, power switch S1 145 may conduct in response to the drive signal $U_D$ 144 from the primary controller 133 to regulate the output quantity $U_O$ 136. The switching period $T_S$ 271 may be separated into two sections of time: switch on-time $t_{ON}$ 269 and switch off-time $t_{OFF}$ 270. Switch on-time $t_{ON}$ 269 denotes the portion of the switching period $T_S$ 271 which the power switch S1 145 is conducting. Switch off-time $t_{OFF}$ 270 denotes the remaining portion of the switching period $T_S$ 271 when the power switch S1 110 is not conducting. The current waveform of FIG. 2 shows two fundamental modes of operation. The trapezoidal shape 272 is characteristic of CCM, whereas the triangular shape 273 is characteristic of DCM. During CCM, the current through the power switch S1 145 is substantially non-zero immediately after the start of the switch on-time $t_{ON}$ 269 and steadily increases throughout the switch on-time $t_{ON}$ 269. During DCM, the current through the power switch S1 145 is substantially zero at the beginning of the switch on-time $t_{ON}$ 269, and steadily increases from zero throughout the switch on-time $t_{ON}$ 269.

Figure 3:
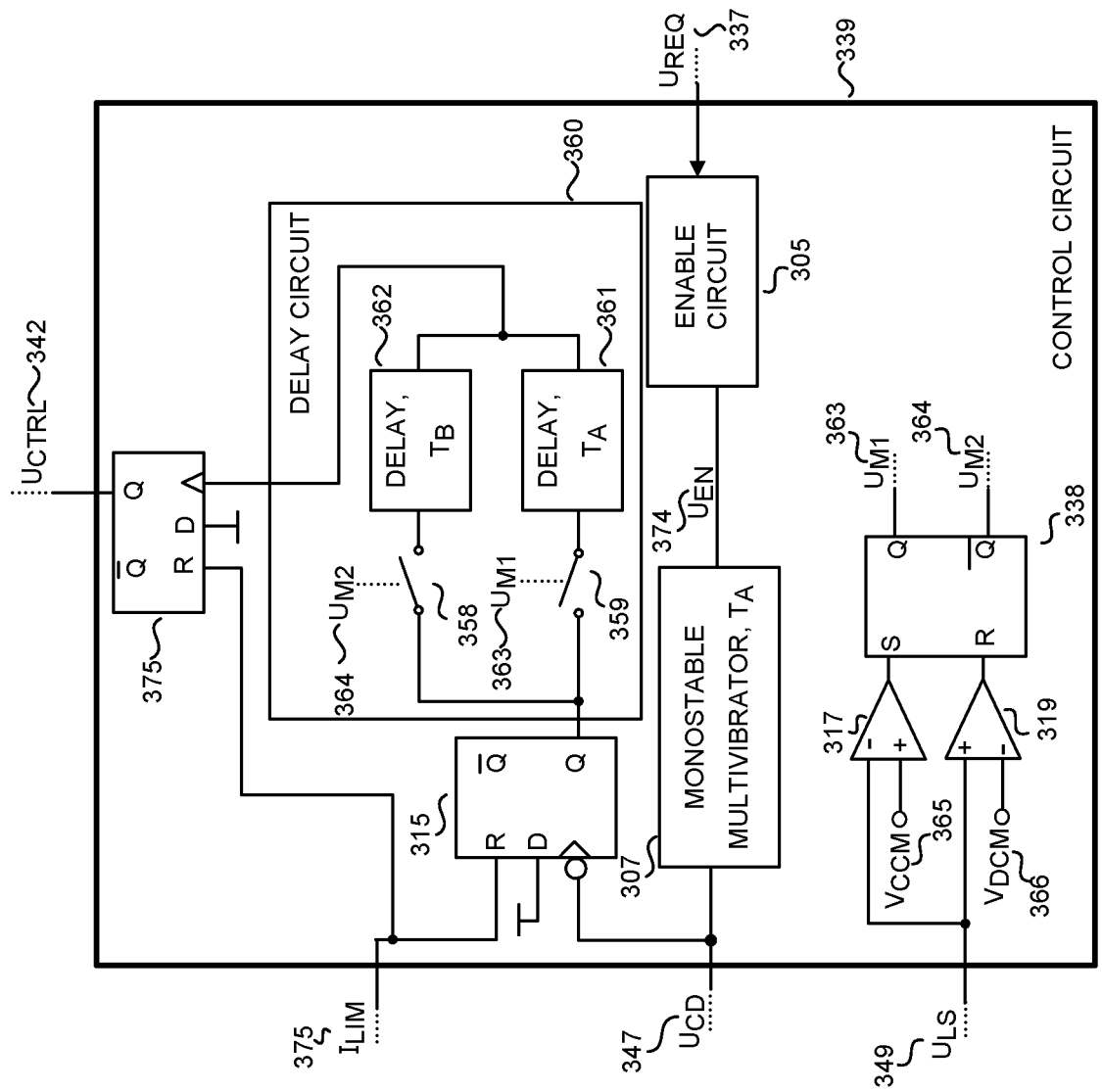
FIG. 3 illustrates one example of a control circuit used in FIG. 1, in accordance with embodiments of the present disclosure.

FIG. 3 illustrates one example of a control circuit used in FIG. 1, in accordance with embodiments of the present disclosure. It is appreciated that control circuit 339 of FIG. 3 may be one example of control circuit 139 of FIG. 1, and that similarly named and numbered elements referenced below are coupled and function similar to as described above.

The control circuit 339 includes an enable circuit 305, flip flops 315, 375, a set-reset (SR) latch 338, comparators 317, 319, a delay circuit 360, and a monostable multivibrator 307. The delay circuit 360 comprises a first switch 358, a second switch 359, a first delay circuit 361, and a second delay circuit 362.

The control circuit 339 can select the control signal $U_{CTRL}$ 342, which is representative of the delay time to turn on the power switch. The delay time depends on the mode of operation of the power converter, which is in response to the input line voltage sense signal $U_{LS}$ 349, the input line voltage sense signal is representative of the line input voltage. The comparator 317 is coupled to receive the input line voltage sense signal $U_{LS}$ 349 at the inverting input and a CCM threshold $V_{CCM}$ 365 at the non-inverting input. Comparator 317 is configured to generate an output with a first state when the input line voltage sense signal $U_{LS}$ 349 is less than the CCM threshold $V_{CCM}$ 365, and further generates a second state when the input line voltage sense signal $U_{LS}$ 349 is not less than the CCM threshold $V_{CCM}$ 365. The output of comparator 317 is coupled to the set input of the SR latch 338. The SR latch 338 is configured to output a first state of a first mode of operation signal $U_{M1}$ 363 in response to the set input. In the example of FIG. 3, the first state of the first mode of operation signal $U_{M1}$ 363 can be a logic high. The first mode of operation represents a CCM operation of the power converter. The SR latch 338 is further configured to output a second mode of operation signal $U_{M2}$ 364 at the inverted output of the SR latch 338. In the example of FIG. 3, the first state of the second mode of operation signal $U_{M2}$ 364 can be a logic low.

Comparator 319 is coupled to receive the input line voltage sense signal $U_{LS}$ 349 at the inverting input and a DCM threshold $V_{DCM}$ 366 at the non-inverting input. Comparator 319 is configured to generate a first output when the input line voltage sense signal $U_{LS}$ 349 is greater than the DCM threshold $V_{DCM}$ 366, and further generates a second state when the input line voltage sense signal $U_{LS}$ 349 is not greater than the DCM threshold $V_{DCM}$ 366. The output of comparator 319 is coupled to the reset input of the SR latch 338. The SR latch 338 is configured to output the second state of the first mode of operation signal $U_{M1}$ 364 in response to the reset input. In the example of FIG. 3, the second state of the first mode of operation signal $U_{M1}$ 363 can be a logic low. The SR latch 338 is further configured to output the second mode of operation signal $U_{M2}$ 364 at the inverted output of the SR latch 338. In the example of FIG. 3, the second state of second of the second mode of operation signal $U_{M2}$ 364 can be a logic high. The second mode of operation represents a DCM operation of the power converter.

Prior to the turn on of the power switch, control circuit 339 turns on the clamp switch to discharge the clamp capacitor. The enable circuit 305 is coupled to receive the request signal $U_{REQ}$ 135 and configured to generate the enable signal $U_{EN}$ 374. The request signal $U_{REQ}$ 337 is representative of a determination to turn on the power switch. The monostable multivibrator 307 is coupled to the enable circuit 305. The monostable multivibrator 307 is configured to output a pulse for a first duration, wherein the first duration begins near an end of an off time of the power switch to in response to a determination to turn on the power switch through the request signal $U_{REQ}$ 337. The pulse is represented by a clamp drive signal $U_{CD}$ 347. After the duration of the pulse ends, the flip flop 315 is configured to generate a first logic state in response to the clamp drive signal $U_{CD}$ 347. The output of flip flop 315 is coupled to switches 358 and 359. The switch 359 is closed by the first mode of operation signal $U_{M1}$ 359, and the flip flop 375 is clocked by the output of the first delay circuit 361. The first delay circuit 361 outputs a first delay, which is the control signal $U_{CTRL}$ 342. The switch 358 is closed by the second mode of operation signal $U_{M2}$ 364, and the flip flop 375 is clocked by the output of the second delay circuit 362. The second delay circuit 362 outputs a second delay, which is the control signal $U_{CTRL}$ 342. The second delay time is greater than the first delay. In one example, the first delay time can be in the range of 50 ns and the second delay time can be in the range from 200 ns. In the first mode of operation, the first delay time accounts for the time of the leakage inductance to bring the drain to source voltage of the power switch to substantially zero. In the second mode of operation, the second delay time accounts for the time of the leakage inductance and the magnetizing inductance to bring the drain to source voltage of the power switch to substantially zero.

Figure 4A:
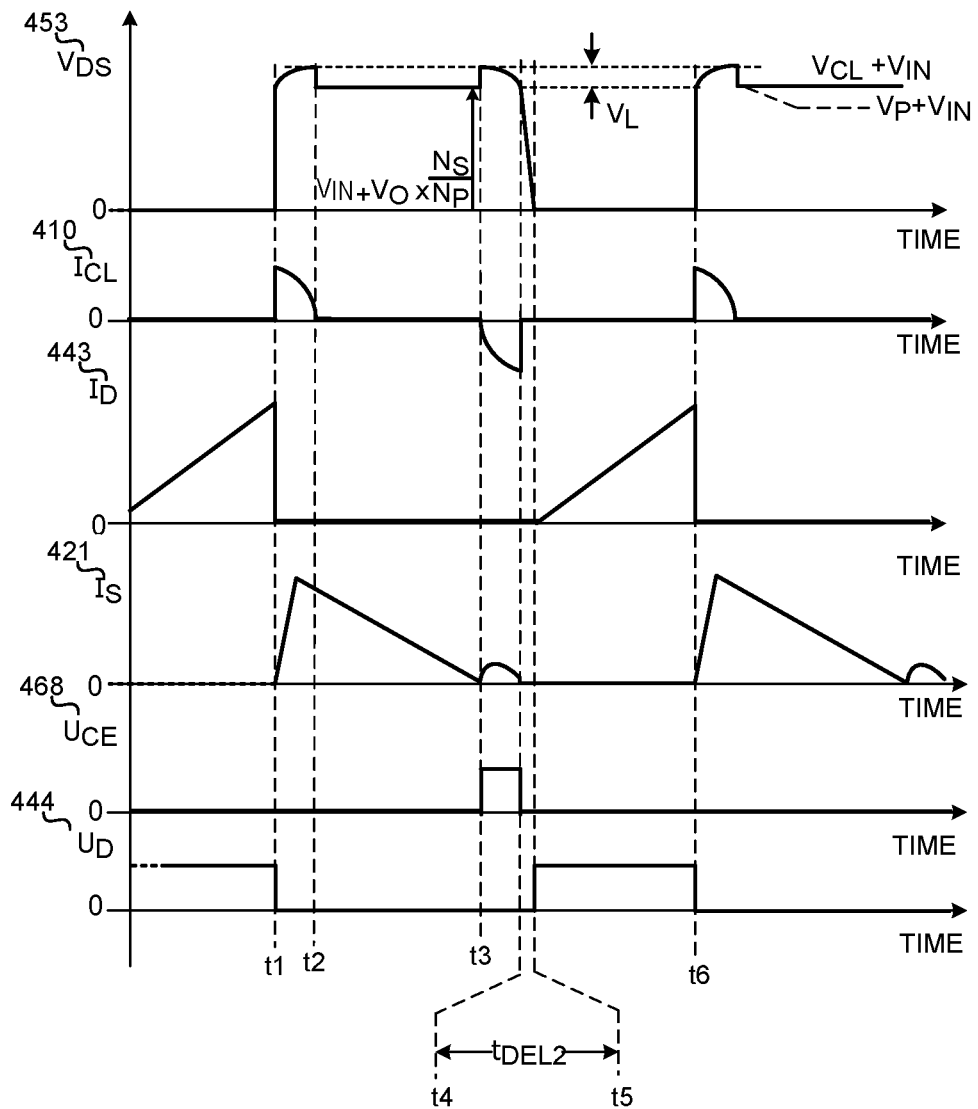
FIG. 4A illustrates another example of a timing diagram that illustrates signals of a power converter such as a drain voltage, a clamp current, a drain current, a secondary current, an enable signal, and a drive signal, in accordance with embodiments of the present disclosure.

FIG. 4A illustrates a timing diagram illustrating a drain-source voltage, a clamp current, a switch current of the power switch, a secondary current, an enable signal, and a drive signal. It is appreciated that the signals mentioned of FIG. 4A may be one example of signals of FIG. 1, and that similarly named and numbered elements referenced below are coupled and function similar to as described above.

The first timing diagram illustrates a drain to source voltage $V_{DS}$ 453. The second timing diagram illustrates a clamp current $I_{CL}$ 410. The third timing diagram illustrates a switch current $I_D$ 443. The fourth timing diagram illustrates a secondary current $I_S$ 421. The fifth timing diagram illustrates clamp enable signal $U_{CE}$ 468. The sixth timing diagram illustrates a drive signal $U_D$ 444.

In the example of FIG. 4A, the mode of operation for the power converter is critical conduction mode (CRM), signified by the triangular shape of the switch current $I_D$ 443. CRM can occur when the line sense input voltage is above the CCM threshold, but below the DCM threshold. In some designs, CRM is capable of using the control signal generated by either the first delay circuit or the second delay circuit as discussed in FIG. 3. At time before t1, the power switch is turned on, such that the drain to source voltage $V_{DS}$ 453 is zero. The clamp current $I_{CL}$ 410 is zero. The switch current $I_D$ 443 is rising. The secondary current $I_S$ 421 is zero. The clamp enable signal $U_{CE}$ 468 is zero. The drive signal $U_D$ 444 is a logic high.

At time t1, the power switch is turned off, as denoted by the drive signal $U_D$ 444 is a logic low. As a result, the drain to source voltage $V_{DS}$ 453 rises to the input voltage plus the clamp voltage. The clamp capacitor is being charged as denoted by the clamp current $I_{CL}$ 410. Energy stored in the energy transfer element is transferred from the primary winding to the secondary winding as shown by the linearly decreasing waveform of the secondary current Is 421. After t1 and before t2, the drain to source voltage $V_{DS}$ 453 rises and is equal to the input voltage plus the clamp voltage. The clamp capacitor continues charging as denoted by the clamp current $I_{CL}$ 410 decaying to zero. The drive signal $U_D$ 444 is logic low, therefore the switch current $I_D$ 443 is also zero.

At time t2, drain to source voltage $V_{DS}$ 453 reduces to the input voltage plus the reflected output voltage of the secondary winding. The clamp current $I_{CL}$ 410 is zero, signifying the clamp capacitor is no longer being charged. The switch current $I_D$ 443 is zero as energy was transferred by the primary winding to the secondary winding. The secondary current $I_S$ 421 is a non-zero value and reducing in a linear fashion. The clamp enable signal $U_{CE}$ 468 is logic low. The drive signal $U_D$ 444 is logic low. At time between t2 to t3, the drain to source voltage $V_{DS}$ 453 is a non-zero value and with a slope of zero representing that the synchronous rectifier is conducting. The clamp current $I_{CL}$ 410 is zero. The secondary current $I_S$ 421 is decreasing linearly. The clamp enable signal $U_{CE}$ 468 is logic low. The drive signal $U_D$ 444 is logic low.

At time t3, the clamp driver generates a clamp enable signal $U_{CE}$ 468 to turn on the clamp switch prior to the turn of the power switch. The drain to source voltage $V_{DS}$ 453 rises to the clamp voltage plus the input voltage. The clamp capacitor discharges as denoted by the negative polarity of the clamp current $I_{CL}$ 410 due to energy being transferred to the secondary winding of the energy transfer element. The switch current $I_D$ 443 is zero. The secondary current $I_S$ 421 begins to increase due to the turn of the clamp switch. The drive signal $U_D$ 444 is logic low as the power switch is off.

At time t4, the clamp enable signal $U_{CE}$ 468 transitions to logic low. The clamp current $I_{CL}$ 410 drops to zero. The switch current $I_D$ 443 is zero. The drain to source voltage $V_{DS}$ 453 reduces toward the input voltage. The drive signal $U_D$ 444 is logic low.

The time between t4 and time t5 represents the second delay time as discussed in FIG. 2, as shown by $t_{DEL2}$. With respect to FIG. 2, the second delay time is represented as TB. The magnetizing inductance and the leakage inductance reduces to the drain to source voltage $V_{DS}$ 453 to zero to provide zero voltage switching. In other examples for CRM, the leakage inductance can reduce the drain to source voltage $V_{DS}$ 453 to zero to provide ZVS of the power switch. The clamp current $I_{CL}$ 410 is zero. The switch current $I_D$ 443 is zero. The secondary current $I_S$ 421 is zero. The clamp enable signal $U_{CE}$ 468 is logic low. The drive signal $U_D$ 444 is logic low.

At time t5, is the end of the delay time $t_{DEL2}$. The drain to source voltage $V_{DS}$ 453 is zero, and the power switch is turned on as denoted by the drive signal $U_D$ 444 transitioning to logic high. The clamp current $I_{CL}$ 410 is zero. The switch current $I_D$ 443 begins to increase linearly. The secondary current $I_S$ 421 is zero. The clamp enable signal $U_{CE}$ 468 is logic low.

At time after t5 and before t6, the power switch is on as denoted by the logic high of the drive signal $U_D$ 444. The drain to source voltage $V_{DS}$ 453 is zero. The switch current $I_D$ 443 rises linearly. In one example, the switch current $I_D$ 443 continues to rise until it hits the current limit (not shown). The secondary current $I_S$ 421 is zero. The clamp enable signal $U_{CE}$ 468 is zero.

At time t6, the power switch is turned off, as denoted by the drive signal $U_D$ 444 is a logic low. As a result, the drain to source voltage $V_{DS}$ 453 rises to the input voltage plus the clamp voltage. The clamp capacitor is being charged as denoted by the clamp current $I_{CL}$ 410. Energy stored in the energy transfer element is transferred from the primary winding to the secondary winding as shown by the linearly increasing waveform of the secondary current Is 421. After t1 and before t2, the drain to source voltage is equal to the input voltage plus the clamp voltage. The clamp capacitor is still charging as denoted by the clamp current $I_{CL}$ 410 decaying to zero. The drive signal $U_D$ 444 is logic low, therefore the switch current $I_D$ 443 is also zero.

Figure 4B:
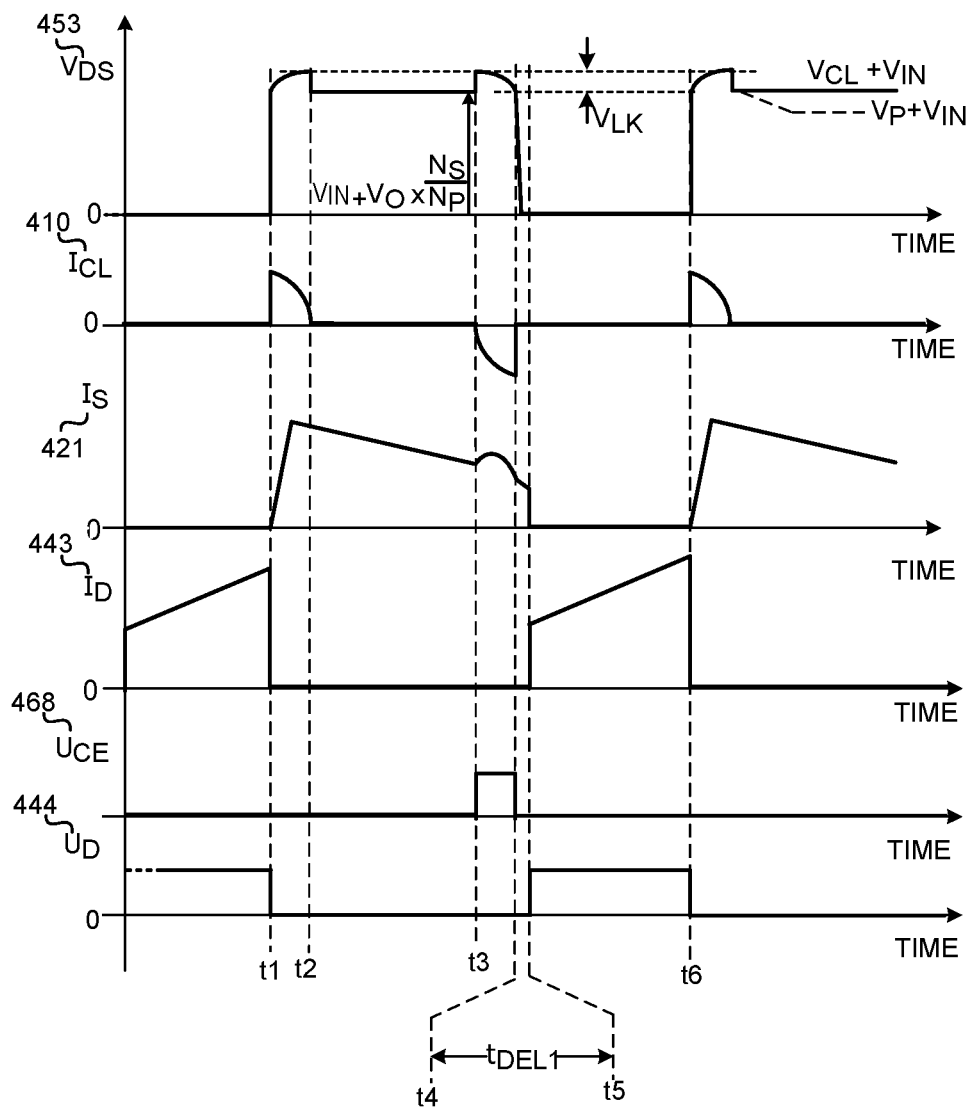
FIG. 4B illustrates another example of a timing diagram that illustrates signals of a power converter such as a drain-source voltage, a clamp current, a drain current, a secondary current, an enable signal, and a drive signal, in accordance with embodiments of the present disclosure.

FIG. 4B illustrates a timing diagram illustrating a drain-source voltage, a clamp current, a switch current of the power switch, a secondary current, a clamp enable signal, and a drive signal. It is appreciated that the signals mentioned of FIG. 4B may be one example of signals of FIG. 1, and that similarly named and numbered elements referenced below are coupled and function similar to as described above.

The first timing diagram illustrates a drain to source voltage $V_{DS}$ 453. The second timing diagram illustrates a clamp current $I_{CL}$ 410. The third timing diagram illustrates a switch current $I_D$ 443. The fourth timing diagram illustrates a secondary current $I_S$ 421. The fifth timing diagram illustrates clamp enable signal $U_{CE}$ 468. The sixth timing diagram illustrates a drive signal $U_{DR}$ 444.

In the example of FIG. 4B, the mode of operation for the power converter is CCM, signified by the trapezoidal shape of the switch current $I_D$ 443. At time before t1, the power switch is turned on, such that the drain to source voltage VDs 453 is zero. The clamp current $I_{CL}$ 410 is zero. The switch current $I_D$ 443 is rising. The secondary current $I_S$ 421 is zero. The clamp enable signal $U_{CE}$ 468 is zero. The drive signal $U_D$ 444 is a logic high.

At time t1, the power switch is turned off, as denoted by the drive signal $U_D$ 444 transitioning to a logic low. As a result, the drain to source voltage VDs 453 rises to the input voltage plus the clamp voltage. The clamp capacitor is being charged as denoted by the clamp current $I_{CL}$ 410. Energy stored in the energy transfer element is transferred from the primary winding to the secondary winding as shown by the increase in secondary current $I_S$ 421. After t1 and before t2, the drain to source voltage VDs 453 is equal to the input voltage plus the clamp voltage. The clamp capacitor continues charging as denoted by the clamp current $I_{CL}$ 410 decaying to zero. The secondary current $I_S$ 421 rises as energy is transferred from the primer winding to the secondary winding. The drive signal $U_D$ 444 is logic low, therefore the switch current $I_D$ 443 is also zero.

At time t2, the drain to source voltage $V_{DS}$ 453 reduces to the input voltage plus the reflected output voltage of the secondary winding. The clamp current $I_{CL}$ 410 is zero, indicating the clamp capacitor is no longer being charged. The switch current $I_D$ 443 is zero as energy was transferred by the primary winding to the secondary winding. The secondary current $I_S$ 421 is a non-zero value and reducing in a linear fashion. The clamp enable signal $U_{CE}$ 468 is logic low. The drive signal $U_{DR}$ 444 is logic low. At time between t2 to t3, the drain to source voltage $V_{DS}$ 453 is a non-zero value and with slope of zero representing that the synchronous rectifier is conducting. The clamp current $I_{CL}$ 410 is zero. The secondary current $I_S$ 421 is decreasing linearly. The clamp enable signal $U_{CE}$ 468 is logic low. The drive signal $U_D$ 444 is logic low.

At time t3, the clamp driver generates a clamp enable signal $U_{CE}$ 468 to turn on the clamp switch prior to the turn of the power switch. The drain to source voltage $V_{DS}$ 453 rises to the clamp voltage plus the input voltage. The clamp capacitor discharges as denoted by the negative polarity of the clamp current $I_{CL}$ 410 due to energy being transferred from the primary winding to the secondary winding of the energy transfer element. The secondary current $I_S$ 421 is non zero and a rises slightly due to energy stored in the clamp capacitor being transferred to the secondary. The switch current $I_D$ 443 is zero. The drive signal $U_D$ 444 is logic low as the power switch is off.

At time t4, the clamp enable signal $U_{CE}$ 468 transitions to logic low. The drain to source voltage $V_{DS}$ 453 is decaying quickly to zero. The clamp current $I_{CL}$ 410 is zero. The switch current $I_D$ 443 is zero. The drive signal $U_{DR}$ 444 is logic low.

The time between t4 and time t5 represents the first delay time as discussed in FIG. 2 shown as time $T_A$, and illustrated as $T_{DEL1}$ in FIG. 3. The discharging of the leakage inductance reduces to the drain to source voltage $V_{DS}$ 453 to zero to provide ZVS of the power switch. The clamp current $I_{CL}$ 410 is zero. The switch current $I_D$ 443 is zero. The secondary current $I_S$ 421 is decreasing toward zero. The clamp enable signal $U_{CE}$ 468 is logic low. The drive signal $U_D$ 444 is logic low.

At time t5, the drain to source voltage $V_{DS}$ 453 is zero, and the power switch is turned on as denoted by the drive signal $U_D$ 444 transitioning to logic high. The clamp current $I_{CL}$ 410 is zero. The switch current $I_D$ 443 begins to increase linearly. The secondary current Is 421 is zero. The clamp enable signal $U_{CE}$ 468 is logic low.

At time after t5 and before t6, the power switch is on as denoted by the logic high of the drive signal $U_D$ 444. The drain to source voltage $V_{DS}$ 453 is zero. The switch current $I_D$ 443 continues to rise linearly. In one example, the switch current $I_D$ 443 continues to rise until it hits the current limit (not shown). The secondary current $I_S$ 421 is zero. The clamp enable signal $U_{CE}$ 468 is zero.

At time t6, the power switch is turned off, as denoted by the drive signal $U_D$ 444 transitioning to a logic low. As a result, the drain to source voltage $V_{DS}$ 453 rises to the input voltage. The clamp capacitor is being charged as denoted by the clamp current $I_{CL}$ 410. Energy stored in the energy transfer element is transferred from the primary winding to the secondary winding as shown by the increase in secondary current $I_S$ 421. After t6, the drain to source voltage $V_{DS}$ 453 rises to the input voltage plus the clamp voltage. The clamp capacitor continues charging as denoted by the clamp current $I_{CL}$ 410 decaying to zero. The drive signal $U_D$ 444 is logic low, therefore the switch current $I_D$ 443 is also zero.

Figure 4C:
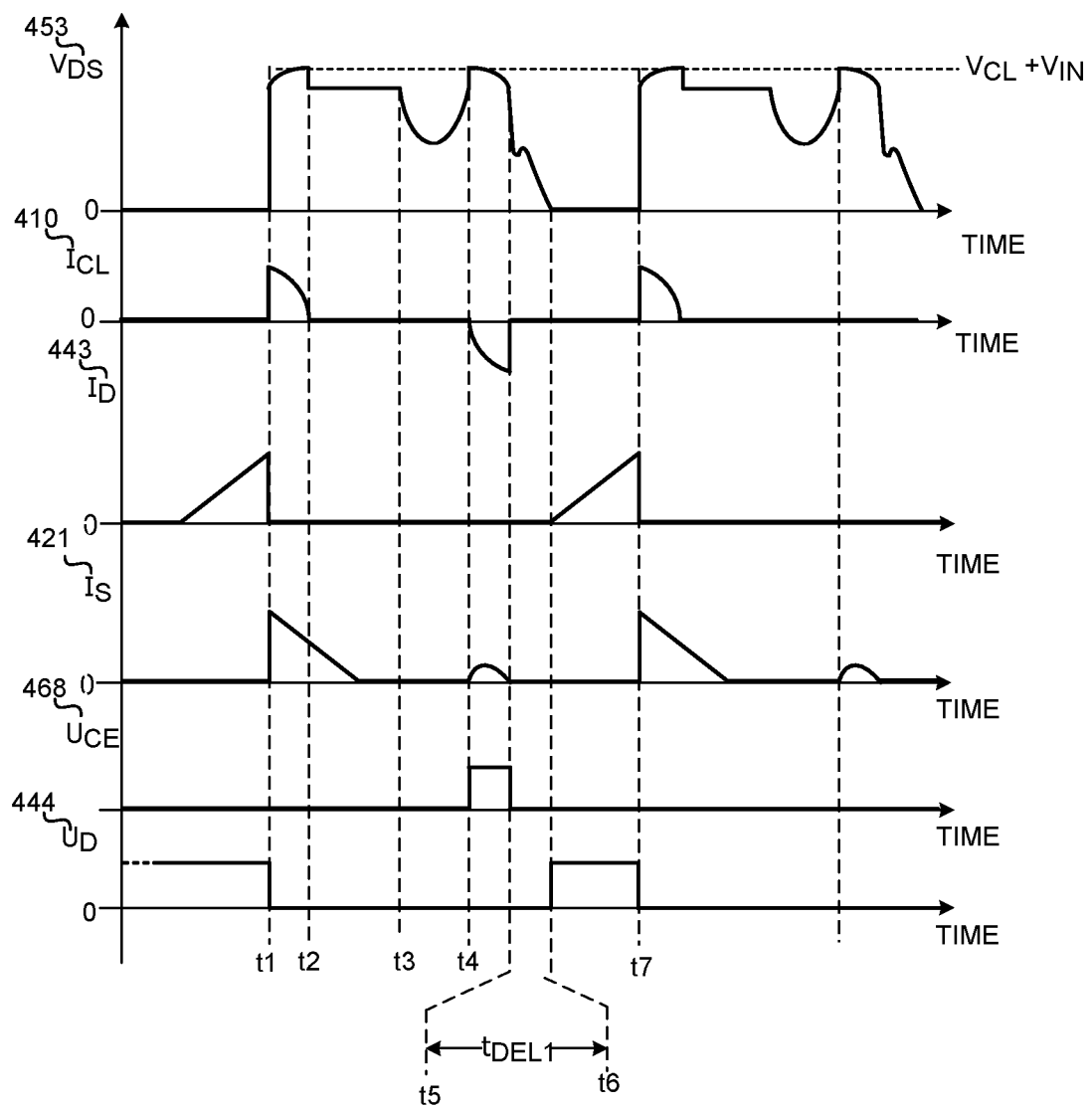
FIG. 4C illustrates a timing diagram illustrating a drain-source voltage, a clamp current, a switch current of the power switch, a secondary current, a clamp enable signal, and a drive signal, in accordance with embodiments of the present disclosure.

FIG. 4C illustrates a timing diagram illustrating a drain-source voltage, a clamp current, a switch current of the power switch, a secondary current, a clamp enable signal, and a drive signal. It is appreciated that the signals mentioned of FIG. 4C may be one example of signals of FIG. 1, and that similarly named and numbered elements referenced below are coupled and function similar to as described above.

The first timing diagram illustrates a drain to source voltage $V_{DS}$ 453. The second timing diagram illustrates a clamp current $I_{CL}$ 410. The third timing diagram illustrates a switch current $I_D$ 443. The fourth timing diagram illustrates a secondary current $I_S$ 421. The fifth timing diagram illustrates a clamp enable signal $U_{CE}$ 468. The sixth timing diagram illustrates a drive signal $U_D$ 444.

In the example of FIG. 4C, the mode of operation for the power converter is DCM, signified by the triangular shape of the switch current $I_D$ 443. At time before t1, the power switch is turned on, such that the drain to source voltage $V_{DS}$ 453 is zero. The clamp current $I_{CL}$ 410 is zero. The switch current $I_D$ 443 is rising. The secondary current $I_S$ 421 is zero. The clamp enable signal $U_{CE}$ 468 is zero. The drive signal $U_D$ 444 is a logic high.

At time t1, the power switch is turned off, as denoted by the drive signal $U_D$ 444 is a logic low. As a result, the drain to source voltage $V_{DS}$ 453 rises to the input voltage. The clamp capacitor charges as denoted by the clamp current $I_{CL}$ 410. Energy stored in the energy transfer element is transferred from the primary winding to the secondary winding as shown by the sharp increase of the secondary current $I_S$ 421. After t1 and before t2, the drain to source voltage $V_{DS}$ 453 rises to the input voltage plus the clamp voltage. The clamp capacitor continues charging as denoted by the clamp current $I_{CL}$ 410 decaying to zero. The drive signal $U_D$ 444 is logic low, therefore the switch current $I_D$ 443 is also zero.

At time t2, the drain to source voltage $V_{DS}$ 453 reduces to the input voltage plus the reflected output voltage of the secondary winding. The clamp current $I_{CL}$ 410 is zero, signifying the clamp capacitor is no longer being charged. The switch current $I_D$ 443 is zero as energy was transferred from the primary winding to the secondary winding. The secondary current $I_S$ 421 is a non-zero value and reducing in a linear fashion. The clamp enable signal $U_{CE}$ 468 is logic low. The drive signal $U_D$ 444 is logic low. At time between t2 to t3, the drain to source voltage $V_{DS}$ 453 is a non-zero value and with slope of zero representing that the synchronous rectifier is conducting. The clamp current $I_{CL}$ 410 is zero. The secondary current Is 421 decreases linearly. The clamp enable signal $U_{CE}$ 468 is logic low. The drive signal $U_D$ 444 is logic low.

At time t3, the drain to source voltage $V_{DS}$ 343 begins to oscillate caused by completion of energy transfer from the primary winding and the secondary winding, such that the secondary current $I_S$ 421 is zero. The oscillation is caused by the resonant tank formed by the leakage and magnetizing inductances and the resonant capacitance of the power switch. At time t4, the drain to source voltage $V_{DS}$ 453 is at peak value and the clamp driver generates a clamp enable signal $U_{CE}$ 468 to turn on the clamp switch prior to the turn of the power switch which causes the drain to source voltage $V_{DS}$ 453 to rise to the input voltage plus the clamp voltage again. The clamp capacitor discharges as denoted by the negative polarity of the clamp current $I_{CL}$ 410 due to energy being transferred from the clamp capacitor through the primary winding to the secondary winding of the energy transfer element. The switch current $I_D$ 443 is zero. The secondary current $I_S$ 421 begins to increase due to the turn on of the clamp switch, signifying energy stored from the clamp capacitor is transferred to the secondary winding through the primary winding. The drive signal $U_D$ 444 is logic low as the power switch is off.

At time t5, the clamp enable signal $U_{CE}$ 468 transitions to logic low. The clamp current $I_{CL}$ 410 drops to zero. The switch current $I_D$ 443 is zero. The drain to source voltage $V_{DS}$ 453 reduces towards zero. The drive signal $U_{DR}$ 444 is logic low.

The time between t5 and before time t6 represents the delay time as discussed in FIG. 2, as shown by $t_{DEL1}$. Although the drain to source voltage $V_{DS}$ 453 is decreasing towards zero, the leakage inductance causes a slight increase momentarily. For DCM operation, the leakage inductance and the magnetizing inductance can reduce the drain to source voltage $V_{DS}$ 453 to zero to provide zero voltage switching. The clamp current $I_{CL}$ 410 is zero. The switch current $I_D$ 443 is zero. The secondary current $I_S$ 421 is zero. The clamp enable signal $U_{CE}$ 468 is logic low. The drive signal $U_D$ 444 is logic low.

At time t6, the drain to source voltage $V_{DS}$ 453 is zero, and the power switch is turned on as denoted by the drive signal $U_D$ 444 transitioning to logic high. The clamp current $I_{CL}$ 410 is zero. The switch current $I_D$ 443 begins to increase linearly. The secondary current Is 421 is zero. The clamp enable signal $U_{CE}$ 468 is logic low.

At time after t6 and before t7, the power switch is on as denoted by the logic high of the drive signal $U_D$ 444. The drain to source voltage $V_{DS}$ 453 is zero. The switch current $I_D$ 443 rises linearly. In one example, the switch current continues to rise until it hits the current limit (not shown). The secondary current $I_S$ 421 is zero. The clamp enable signal $U_{CE}$ 468 is zero.

At time t7, the power switch is turned off and the behavior is the same as after time t1, described before.

Figure 5A:
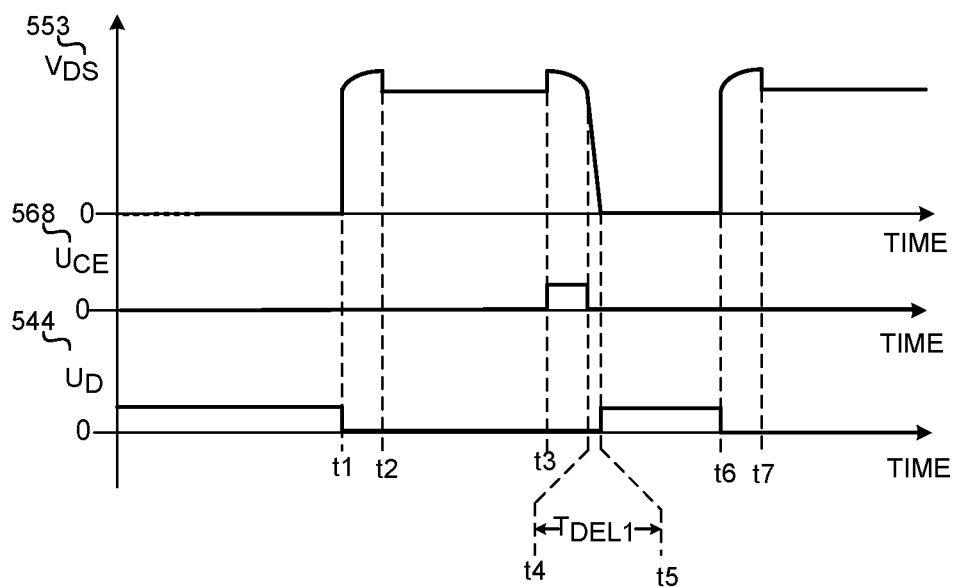
FIG. 5A illustrates an example of a timing diagram that illustrates signals of a power converter such as a drain voltage, an enable signal, and a drive signal, in accordance with embodiments of the present disclosure.

FIG. 5A illustrates an example of a timing diagram that illustrates signals of a power converter such as a drain voltage, an enable signal, and a drive signal, in accordance with embodiments of the present disclosure. It is appreciated that the signals mentioned of FIG. 5A may be one example of signals from previous figures and that similarly named and numbered elements referenced below are coupled and function similar to as described above.

The first timing diagram is a drain to source voltage $V_{DS}$ 553. The second timing diagram is a clamp enable signal $U_{CE}$ 568. The third timing diagram is a drive signal $U_D$ 544. The operation of the power converter is CRM, but could also be CCM. As mentioned previously, CRM can occur when the line sense input voltage is above the CCM threshold, but below the DCM threshold. In some designs, CRM is capable of using the control signal generated by either the first delay circuit or the second delay circuit.

At time before t1, the drive signal $U_D$ 544 is logic high, which signifies the power switch is turned on. The drain to source voltage $V_{DS}$ 553 is zero. The clamp enable signal $U_{CE}$ 568 is logic low. At time t1, the drive signal $U_D$ 544 transitions to logic low, which signifies the power switch is turned off. The drain to source voltage $V_{DS}$ 553 rises to the input voltage. At after time t1 and before t2, the drain to source voltage $V_{DS}$ 553 rises to the clamp voltage plus the input voltage. At time t2, the drain to source voltage $V_{DS}$ 553 reduces to the input voltage plus the reflected output voltage of the secondary winding. At time t3, the clamp enable signal $U_{CE}$ 568 transitions to a logic high. The drain to source voltage $V_{DS}$ 553 rises to the clamp voltage because the clamp switch is turned on. At time after t3 and before t4, the drain to source voltage $V_{DS}$ 553 begins to decrease. The clamp enable signal $U_{CE}$ 568 is logic high. The drive signal $U_D$ 544 is logic low.

At time t4, the clamp enable signal $U_{CE}$ 568 transitions to a logic low. The drain to source voltage $V_{DS}$ 553 reduces towards zero. After time t4 and before t5 represents the first delay time $t_{DEL1}$ generated as the control signal prior to the turn on of the power switch. At time t5, the drain to source voltage $V_{DS}$ 553 is at zero. The drive signal $U_D$ 544 transitions to a logic high. At time after t5 and before t6, the drain to source voltage $V_{DS}$ 553 is zero. The clamp enable signal $U_{CE}$ 568 is zero. The drive signal $U_D$ 544 is logic high. At time t6, the drive signal $U_{DR}$ 544 transitions to logic low, which signifies the power switch is turned off. The drain to source voltage $V_{DS}$ 553 rises to the input voltage. At after time t6 and before t7, the drain to source voltage $V_{DS}$ 553 rises to the clamp voltage plus the input voltage. At time t7, the drain to source voltage $V_{DS}$ 553 reduces to the input voltage plus the reflected output voltage of the secondary winding.

Figure 5B:
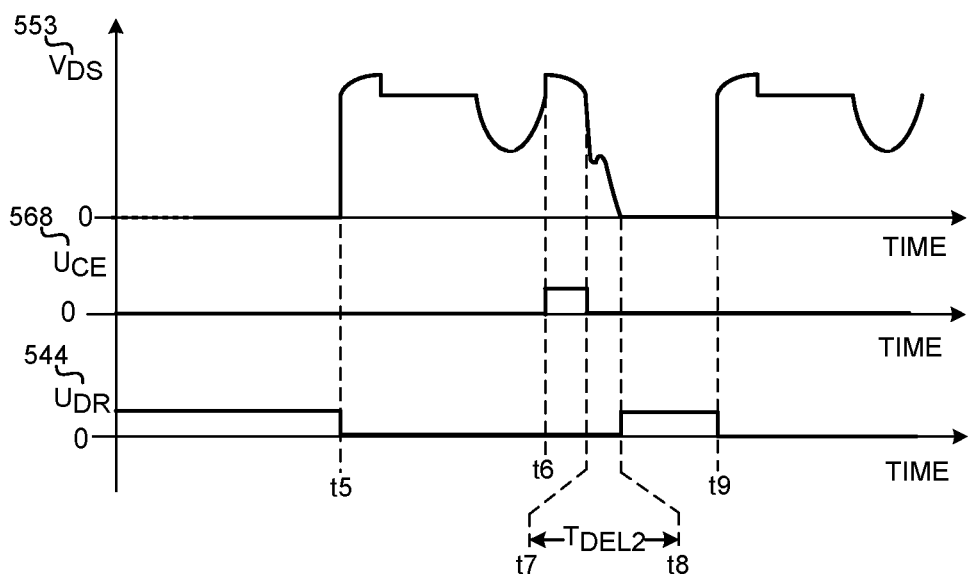
FIG. 5B illustrates an example of a timing diagram that illustrates signals of a power converter such as a drain voltage, an enable signal, and a drive signal, in accordance with embodiments of the present disclosure.

FIG. 5B illustrates an example of a timing diagram that illustrates signals of a power converter such as a drain voltage, an enable signal, and a drive signal, in accordance with embodiments of the present disclosure. It is appreciated that the signals mentioned of FIG. 5B may be one example of signals from previous figures, and that similarly named and numbered elements referenced below are coupled and function similar to as described above.

The power converter is operating in DCM. The first timing diagram is a drain to source voltage $V_{DS}$ 553. The second timing diagram is a clamp enable signal $U_{CE}$ 568. The third timing diagram is a drive signal $U_D$ 544.

At time before t5, the power switch is turned on, such that the drain to source voltage $V_{DS}$ 553 is zero. The drive signal $U_D$ 544 is logic high. The clamp enable signal $U_{CE}$ 568 is logic low.

At time t5, the power switch is turned off, as denoted by the drive signal $U_{DR}$ 544 is a logic low. As a result, the drain to source voltage $V_{DS}$ 553 rises to the input voltage. The clamp enable signal $U_{CE}$ 568 is logic low. After t5 and before t6, the drain to source voltage $V_{DS}$ 553 rises to the input voltage plus the clamp voltage. Afterwards, the drain to source voltage begins to oscillate that is caused by completion of energy transfer from the primary winding to the secondary winding. The oscillation is caused by the resonant tank formed by the leakage and magnetizing inductances and the resonant capacitance of the power switch. The drive signal $U_D$ 444 is logic low. The clamp enable signal $U_{CE}$ 568 is logic low.

At time t6, the clamp enable signal $U_{CE}$ 568 becomes logic high. The drain to source voltage $V_{DS}$ 553 is clamped by the clamp capacitor and the input voltage. At time t7, the clamp enable signal $U_{CE}$ 568 becomes logic low. The drain to source voltage $V_{DS}$ 553 reduces towards zero. After time t7 and before t8 represents the delay $t_{DEL2}$ generated as the control signal prior to the turn on of the power switch. At time t8, the drain to source voltage $V_{DS}$ 553 is at zero. The drive signal $U_D$ 544 transitions to a logic high. At time t8, the power switch is turned on, such that the drain to source voltage $V_{DS}$ 553 is zero. The drive signal $U_{DR}$ 544 is logic high until time t9. The clamp enable signal $U_{CE}$ 568 is logic low until time t9. At time t9, the drive signal $U_{DR}$ 544 becomes logic low and power switch is turned off, and the drain to source voltage $V_{DS}$ 553 starts to rise.

Figure 6A:
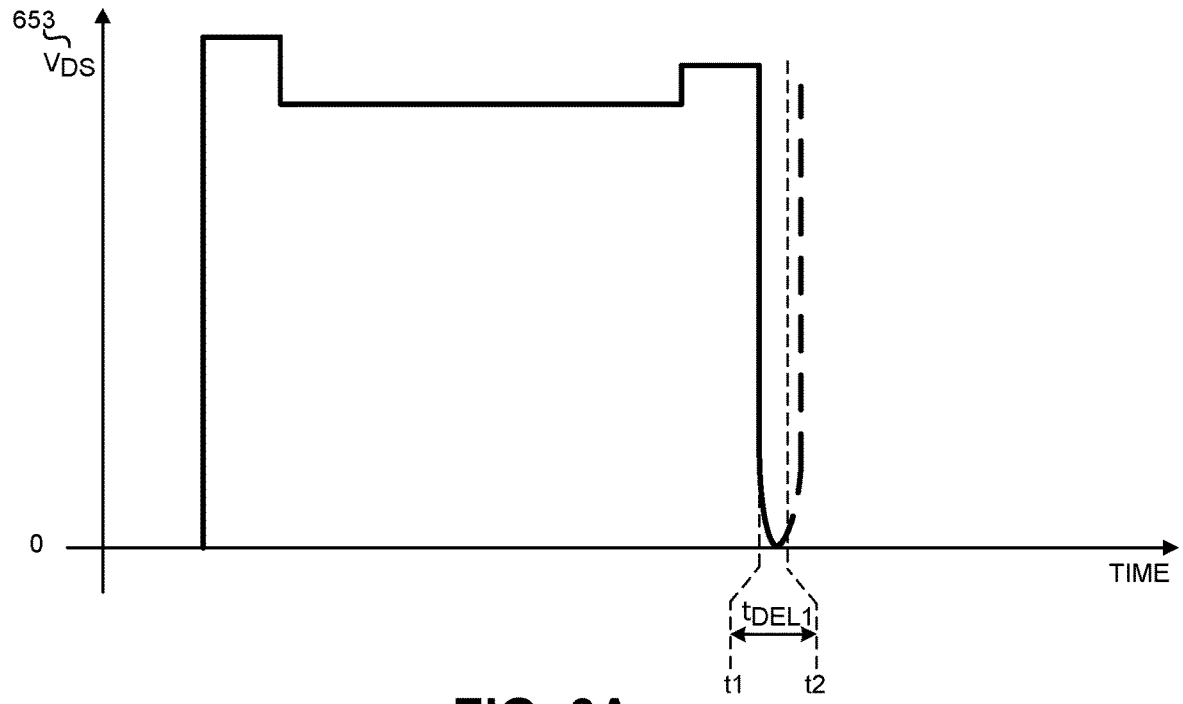
FIG. 6A illustrates an example timing diagram of a drain voltage of a power switch, in accordance with embodiments of the present disclosure.

FIG. 6A illustrates an example timing diagram of a drain voltage of a power switch, in accordance with embodiments of the present disclosure. It is appreciated that the signals mentioned of FIG. 6A may be one example of signals of previous figures, and that similarly named and numbered elements referenced below are coupled and function similar to as described above.

In FIG. 6A, the drain to source voltage $V_{DS}$ 653 is representative of a power converter operating in CCM. The delay time $t_{DEL1}$ represented by time t1 to time t2, is the delay between the clamp switch turning off and the power switch turning on. As mentioned previously, only the energy from the leakage inductance can be used to bring the drain to source voltage $V_{DS}$ 653 to zero. After time t2, the dashed line of the drain-source voltage $V_{DS}$ will increase sharply if the power switch does not turn on caused by the resonant tank of the leakage inductance and the resonant capacitance of the power switch.

Figure 6B:
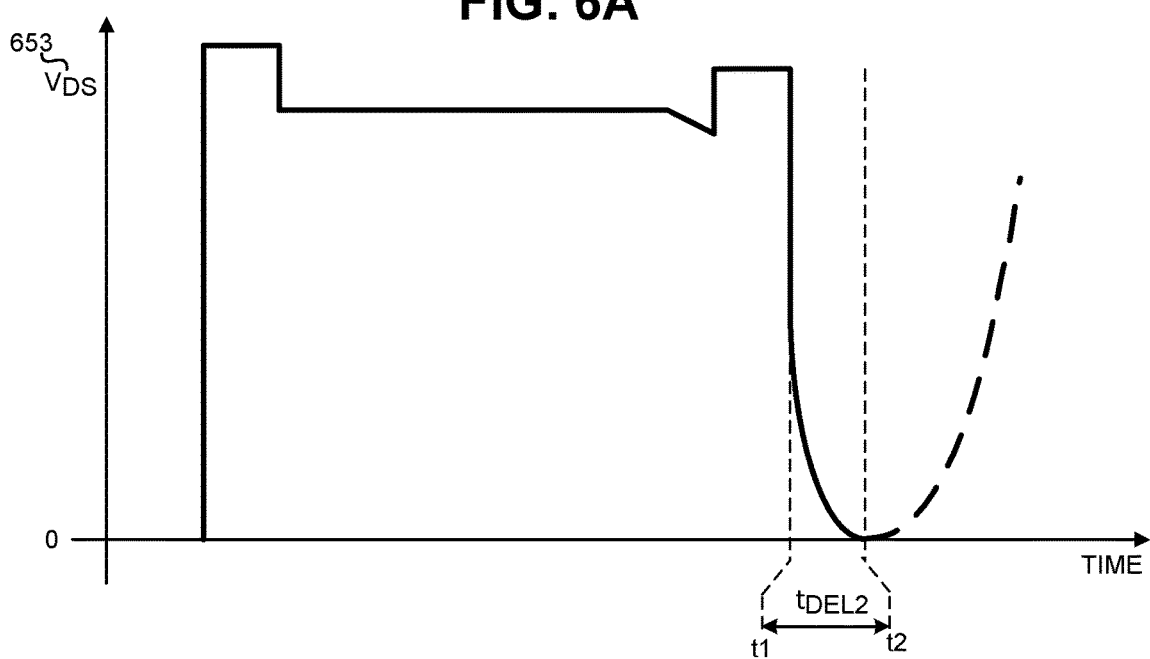
FIG. 6B illustrates another example timing of a drain voltage of a power switch, in accordance with embodiments of the present disclosure.

FIG. 6B illustrates another example timing of a drain voltage of a power switch, in accordance with embodiments of the present disclosure. It is appreciated that the signals mentioned of FIG. 6B may be one example of signals of previous figures, and that similarly named and numbered elements referenced below are coupled and function similar to as described above.

The drain to source voltage $V_{DS}$ 653 is representative of a power converter operating in DCM. The delay time $t_{DEL2}$ represented by time t1 to time t2, represents the delay between the clamp switch turning off and the power switch turning on. The second delay time $t_{DEL2}$ is longer than the first delay time in $t_{DEL1}$ in FIG. 6A. The energy from the leakage inductance and the magnetizing inductance can be used to bring the drain to source voltage $V_{DS}$ 653 to zero. After time t2, the dashed line of the drain-source voltage increases sharply if the power switch does not turn on is caused by the resonant tanking comprising of the leakage and the magnetizing inductances and the resonant capacitance of the power switch.

Figure 6C:
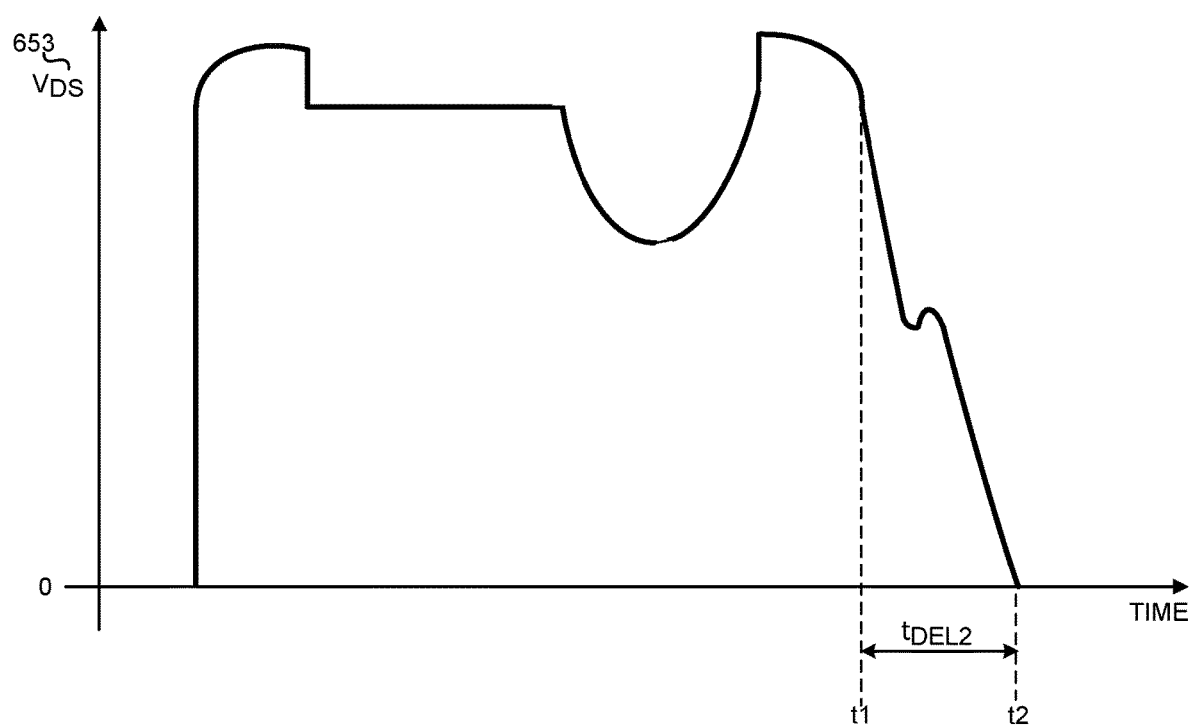
FIG. 6C illustrates another example of a timing diagram drain voltage of a power switch, in accordance with embodiments of the present disclosure.

FIG. 6C illustrates another example of a timing diagram drain voltage of a power switch, in accordance with embodiments of the present disclosure. It is appreciated that the signals mentioned of FIG. 6C may be one example of signals of previous figures, and that similarly named and numbered elements referenced below are coupled and function similar to as described above.

The drain to source voltage $V_{DS}$ 653 is representative of a power converter operating in DCM. The delay time $t_{DEL2}$ represented by time t1 to time t2, represents the delay between the clamp switch turning off and the power switch turning on. Prior to the t1, the oscillation of the drain to source $V_{DS}$ 653 represents the end of secondary of conduction caused by the resonant tank of the leakage inductance and the output capacitance. The time $t_{DEL3}$ represents the time before turning on the power switch. The energy from the leakage inductance and the magnetizing inductance can be used to bring the drain to source voltage $V_{DS}$ 653 to zero. The benefit of using the magnetizing inductance to reduce the drain to source voltage $V_{DS}$ 653 allows for minimal overshoot of a drain to source voltage of a synchronous rectifier.

Figure 7:
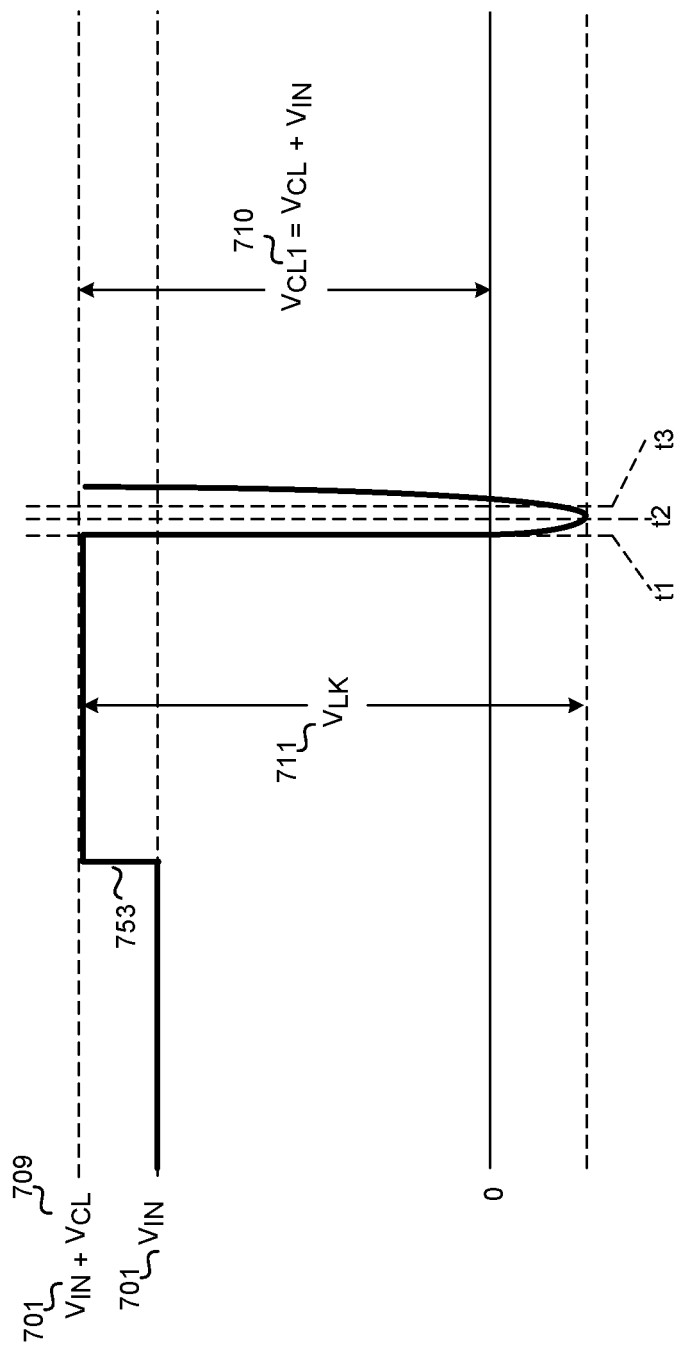
FIG. 7 illustrates a timing diagram of a drain voltage of a power switch, in accordance with embodiments of the present disclosure.

FIG. 7 illustrates a timing diagram of a drain voltage of a power switch, in accordance with embodiments of the present disclosure. It is appreciated that the signals mentioned of FIG. 7 may be one example of signals of previous figures, and that similarly named and numbered elements referenced below are coupled and function similar to as described above.

The timing diagram illustrates a drain to source voltage $V_{DS}$ 753 that rises to the voltage $V_{CL1}$ 710 which is equal to the clamp voltage $V_{CL}$ 709 plus the input voltage $V_{IN}$ 701 when the power switch is turned off, and reaches zero at t2. At time t1, when the clamp switch turns off, the energy stored in in the leakage inductance is $L_{LK}I^2$ with respect to $V_{CL}$. The turn off the clamp switch causes current into the resonant capacitor and begins to charge negatively with respect to the clamp voltage. Depending on the application, the peak current of the power switch is defined. When the peak current of the power switch has been defined, and the amount of energy that will charge the clamp capacitor can be determined, and the leakage inductance to achieve ZVS can be defined by $L_{LK}=(C_{RES}*VC_{L1}^2)/(0.65*I_{LIMPK})^2$. The capacitor $C_{RES}$ is the capacitance of the power switch, and $I_{LIMPK}$ is the peak current of the switch. The time from t1 to t2 represents the time for ZVS to occur is a function of the resonant period formed by the leakage inductance and the resonant capacitance and the theoretical unclamped voltage amplitude of the ring $V_{TOTAL}$ can be defined by $$t_{ZVS} = \frac{\pi\sqrt{L_{LK} \times C_{RES}}}{2 \times \sin^{-1}\frac{V_{CL1}}{V_{LK}}} \quad (1)$$

At time t3, if the power switch is not turned on the resonant tank formed by the leakage inductance and the output capacitance of the power switch can cause the drain to source voltage to rise rapidly.

Figure 8:
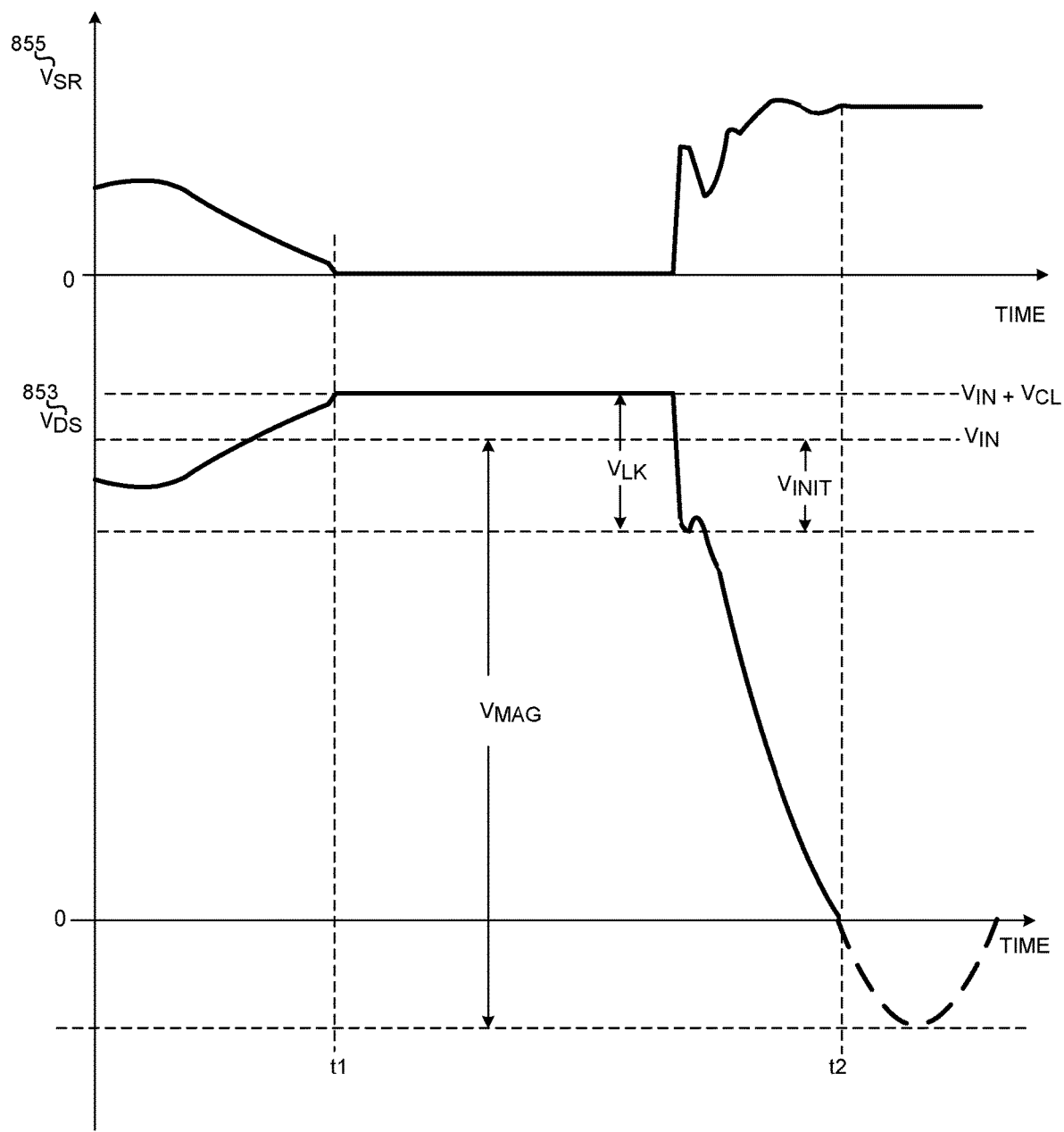
FIG. 8 illustrates a timing diagram of a drain voltage of a synchronous rectifier switch, and a drain voltage of a power switch, in accordance with embodiments of the present disclosure.

FIG. 8 illustrates a timing diagram of a drain voltage of a synchronous rectifier switch, and a drain voltage of a power switch, in accordance with embodiments of the present disclosure. It is appreciated that the signals mentioned of FIG. 8 may be one example of signals mentioned in previous figures, and that similarly named and numbered elements referenced below are coupled and function similar to as described above.

The first timing diagram illustrates a drain to source voltage $V_{SR}$ 855 of the synchronous rectifier. The second timing diagram illustrates a drain to source voltage $V_{DS}$ 853 of the power switch. The drain to source voltage $V_{SR}$ 855 of the synchronous rectifier and the drain to source voltage $V_{DS}$ 853 of the power switch can be reflections of each other. In other words, when the drain to source voltage $V_{DS}$ 853 of the power switch is zero, the drain to source voltage $V_{SR}$ 855 of the synchronous rectifier is positive. When the drain to source voltage $V_{DS}$ 853 of the power switch is positive, the drain to source voltage $V_{SR}$ 855 of the synchronous rectifier is zero.

In FIG. 8, the operation of the power converter is DCM. At time t1, the drain to source voltage $V_{SR}$ 855 of the synchronous rectifier is zero as the synchronous rectifier switch is switched on, while the drain to source voltage $V_{DS}$ 853 of the power switch is at the input voltage plus the clamp voltage when the power switch is off. Prior to the turn of the power switch, the clamp switch is enabled to bring the drain to source voltage $V_{DS}$ 853 of the power switch to zero. As such the energy is stored in the leakage and magnetizing inductance. When the clamp switch is turned off, the leakage inductance reduces the drain to source voltage $V_{DS}$ 853 from the input voltage plus the clamp voltage to a lower value that is clamped by the magnetizing inductance which is represented by the small oscillation in voltage. The discharging of the magnetizing inductance continues to reduce the drain to source voltage $V_{DS}$ 853 of the power switch all the way to zero. The dashed line of the drain to source voltage $V_{DS}$ 853 of the power switch represents the resonant tank that would cause the drain to source voltage $V_{DS}$ 853 to oscillate if the power switch was not turned on.

At time t2, the power switch is turned on when the drain to source voltage $V_{DS}$ 953 of the power switch is zero, which provides a minimal overshoot of the synchronous rectifier.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the claims, it should be understood that the present invention can alternatively be defined in accordance with the following examples:

Example 1: A controller configured for use in a power converter, the controller comprising: a control circuit coupled to receive an input line voltage sense signal representative of an input voltage of the power converter, the control circuit configured to generate a control signal in response to a request signal representative of an output of the power converter, wherein the control signal represents a delay time to turn on a power switch after a turn on of a clamp switch, in response to the input line voltage sense signal, the control circuit further configured to generate a clamp drive signal to control a clamp driver; and a drive circuit configured to generate a drive signal to control the power switch to transfer energy from an input of the power converter to the output of the power converter.

Example 2: The controller of example 1, the control circuit comprising: an enable circuit configured to generate an enable signal in response to the request signal; and a monostable multivibrator configured to generate the clamp drive signal to turn on the clamp switch in response to the enable signal, the monostable multivibrator configured to output a pulse for a first duration, wherein the first duration begins near an end of an off time of the power switch to in response to a determination to turn on the power switch.

Example 3: The controller of any of the previous examples, the control circuit further comprising a flip flop coupled to the monostable multivibrator, the flip flop configured to generate a first logic state in response to the clamp drive signal.

Example 4: The controller of any of the previous examples, wherein the control circuit is further configured to control the clamp driver to inject charge stored in a clamp capacitor into an energy transfer element to discharge a parasitic capacitance of the power switch into the energy transfer element before the power switch is turned on.

Example 5: The controller of any of the previous examples, wherein the control circuit further comprises a delay circuit configured to delay the turn on of the power switch to provide sufficient time for a parasitic capacitance of the power switch to be discharged into an energy transfer element before the power switch is turned on.

Example 6: The controller of any of the previous examples, the delay circuit comprising: a first switch controlled by a first mode of operation signal; a first delay circuit coupled to the first switch, the first delay circuit configured to output the control signal after a first delay time; a second switch controlled by a second mode of operation signal; and a second delay circuit coupled to the second switch, the second delay circuit configured to output the control signal after a second delay time, wherein the second delay time is greater than the first delay time.

Example 7: The controller of any of the previous examples, wherein the control circuit further comprises: a first comparator configured to determine if the input line voltage sense signal is less than a continuous conduction mode (CCM) threshold; a second comparator configured to determine if the input line voltage sense signal is greater than a discontinuous conduction mode (DCM) threshold; and a set-reset (SR) latch having a set input coupled to an output of the first comparator, the SR latch further coupled having a reset input coupled to an output of the second comparator, the SR latch configured to output a first mode of operation signal, the SR latch further configured to output a second mode of operation signal.

Example 8: The controller of any of the previous examples, wherein the first mode of operation signal represents a DCM operation of the power converter.

Example 9: The controller of any of the previous examples, wherein the second mode of operation signal represents a CCM operation of the power converter.

Example 10: A power converter, comprising: an energy transfer element coupled between an input of the power converter and an output of the power converter; a power switch coupled to the energy transfer element; a clamp driver coupled to the energy transfer element and the power switch; and a primary controller coupled to the clamp driver and the power switch, the primary controller comprising: a control circuit configured to generate a control signal in response to a request signal representative of an output of the power converter, wherein the control signal selects one of a plurality of modes of operation to turn on a power switch after a turn on of a clamp switch in response to an input line voltage sense signal, the control circuit further configured to generate a clamp drive signal to control a clamp driver; and a drive circuit configured to generate a drive signal to control the power switch to transfer energy from the input of the power converter to the output of the power converter.

Example 11: The power converter of example 10, the clamp driver comprising a clamp capacitor coupled to the clamp switch, wherein the clamp capacitor is coupled to store a charge that is injected into a primary winding of the energy transfer element through the clamp switch in response to the clamp drive signal.

Example 12: The power converter of any of the previous examples, wherein the energy transfer element further comprises a magnetizing inductance and a leakage inductance between the clamp driver and the primary winding.

Example 13: The power converter of any of the previous examples, wherein the plurality of modes of operation comprises a first mode of operation and a second mode of operation, wherein the first mode of operation is continuous conduction mode (CCM), and wherein the second mode of operation is discontinuous conduction mode (DCM).

Example 14: The power converter of any of the previous examples, wherein the leakage inductance of the energy transfer element reduces a drain to source voltage of the power switch to substantially zero in response to the turn on of the clamp switch.

Example 15: The power converter of any of the previous examples, wherein the leakage inductance and the magnetizing inductance of the energy transfer element reduces a drain to source voltage of the power switch to substantially zero in response to the turn on of the clamp switch.

Example 16: The power converter of any of the previous examples, the clamp driver comprising: a low side driver coupled to receive the clamp drive signal, the low side driver configured to communicate the turn on of the clamp switch; a high side driver coupled to the clamp switch, the high side driver configured to generate a clamp enable signal to control the clamp switch; and a communication link coupled to the low side driver and the high side driver.

Example 17: The power converter of any of the previous examples, the power converter further comprising a secondary controller configured to generate the request signal in response to a feedback signal representative of the output of the power converter.

Example 18: The power converter of any of the previous examples, wherein the secondary controller is galvanically isolated from the primary controller.

Example 19: The power converter of any of the previous examples, an enable circuit configured to generate an enable signal in response to the request signal; and a monostable multivibrator configured to generate the clamp drive signal to turn on the clamp switch in response to the enable signal, the monostable multivibrator further configured to output a pulse for a first duration, wherein the first duration begins near an end of an off time of the power switch in response to a determination to turn on the power switch.

Example 20: The power converter of any of the previous examples, the control circuit further comprising a flip flop coupled to the monostable multivibrator, the flip flop configured to generate a first logic state in response to the clamp drive signal.

Example 21: The power converter of any of the previous examples, wherein the control circuit further comprises a delay circuit configured to delay turning on the power switch to provide sufficient time for a parasitic capacitance of the power switch to be discharged into the energy transfer element before the power switch is turned on.

Example 22: The power converter of any of the previous examples, wherein the delay circuit comprises: a first switch configured to be controlled by a first mode of operation signal; a first delay circuit configured to output the control signal after a first delay time; a second switch coupled to be controlled by a second mode of operation signal; a second delay circuit configured to output the control signal after a second delay time, wherein the second delay time is greater than the first delay time.

Example 23: The power converter of any of the previous examples, the control circuit further comprising: a first comparator configured to determine if the input line voltage sense signal is less than a continuous conduction mode (CCM) threshold; a second comparator configured to determine if the input line voltage sense signal is greater than a discontinuous conduction mode (DCM) threshold; and a set-reset (SR) latch having a set input coupled to an output of the first comparator, the SR latch further coupled having a reset input coupled to an output of the second comparator, the SR latch configured to output a first mode of operation signal, the SR latch further configured to output a second mode of operation signal.

What is claimed is:

1. A controller configured for use in a power converter, the controller comprising:
   a control circuit configured to receive an input line voltage sense signal representative of an input voltage of the power converter, the control circuit configured to generate a control signal in response to a request signal representative of an output of the power converter, wherein the control signal represents a delay time between turning OFF a clamp switch and turning ON a power switch, wherein the delay time is selected in response to the input line voltage sense signal, wherein the control signal is output after a first delay time in response to a first mode of operation signal representative of a continuous conduction mode (CCM) operation of the power converter and is output after a second delay time in response to a second mode of operation signal representative of a discontinuous conduction mode (DCM) operation of the power converter, wherein the second delay time is greater than the first delay time, the control circuit further configured to generate a clamp drive signal to control a clamp driver, wherein the control circuit comprises:
      a first comparator configured to determine if the input line voltage sense signal is less than a CCM threshold;
      a second comparator configured to determine if the input line voltage sense signal is greater than a DCM threshold; and
      a set-reset (SR) latch having a set input coupled to an output of the first comparator, the SR latch further having a reset input coupled to an output of the second comparator, wherein the SR latch is configured to output the first mode of operation signal and the second mode of operation signal; and
   a drive circuit configured to generate a drive signal to control the power switch to transfer energy from the input of the power converter to the output of the power converter in response to the control signal.

2. The controller of claim 1, wherein the control circuit further comprises:
   an enable circuit configured to generate an enable signal in response to the request signal; and
   a monostable multivibrator configured to generate the clamp drive signal to turn on the clamp switch in response to the enable signal, the monostable multivibrator configured to output a pulse for a first duration, wherein the first duration begins near an end of an off time of the power switch in response to a determination to turn on the power switch.

3. The controller of claim 2, wherein the control circuit further comprises a flip flop coupled to the monostable multivibrator, the flip flop configured to generate a first logic state in response to the clamp drive signal.

4. The controller of claim 2, wherein the control circuit further comprises a delay circuit configured to delay the turn on of the power switch to provide sufficient time for a parasitic capacitance of the power switch to be discharged into an energy transfer element before the power switch is turned on.

5. The controller of claim 4, wherein the delay circuit comprises:
   a first switch controlled by the first mode of operation signal;
   a first delay circuit coupled to the first switch, the first delay circuit configured to output the control signal after the first delay time;
   a second switch controlled by the second mode of operation signal; and
   a second delay circuit coupled to the second switch, the second delay circuit configured to output the control signal after the second delay time.

6. The controller of claim 1, wherein the control circuit is further configured to control the clamp driver to inject charge stored in a clamp capacitor into an energy transfer element to discharge a parasitic capacitance of the power switch into the energy transfer element before the power switch is turned on.

7. A power converter, comprising:
   an energy transfer element coupled between an input of the power converter and an output of the power converter;
   a power switch coupled to the energy transfer element;
   a clamp driver coupled to the energy transfer element and the power switch; and
   a primary controller coupled to the clamp driver and the power switch, the primary controller comprising:
      a control circuit configured to generate a control signal in response to a request signal representative of the output of the power converter, wherein the control signal is representative of a selection of one of a plurality of modes of operation to vary the turn ON of the power switch after a turn OFF of a clamp switch in response to an input line voltage sense signal representative of an input voltage of the power converter, the plurality of modes of operation comprises a first mode of operation signal and a second mode of operation signal, wherein the control signal is output after a first delay time in response to the first mode of operation signal representative of a continuous conduction mode (CCM) and is output after a second delay time in response to the second mode of operation signal representative of a discontinuous conduction mode (DCM), wherein the second delay time is greater than the first delay time, the control circuit further configured to generate a clamp drive signal to control the clamp driver, the control circuit comprising:
         a first comparator configured to determine if the input line voltage sense signal is less than a CCM threshold;
         a second comparator configured to determine if the input line voltage sense signal is greater than a DCM threshold; and
         a set-reset (SR) latch having a set input coupled to an output of the first comparator, the SR latch further having a reset input coupled to an output of the second comparator, wherein the SR latch is configured to output the first mode of operation signal and the second mode of operation signal; and
      a drive circuit configured to generate a drive signal to control the power switch to transfer energy from the input of the power converter to the output of the power converter in response to the control signal.

8. The power converter of claim 7, wherein the clamp driver comprises a clamp capacitor coupled to the clamp switch, wherein the clamp capacitor is configured to store a charge that is injected into a primary winding of the energy transfer element through the clamp switch in response to the clamp drive signal.

9. The power converter of claim 8, wherein the energy transfer element further comprises a magnetizing inductance and a leakage inductance between the clamp driver and the primary winding.

10. The power converter of claim 9, wherein the leakage inductance of the energy transfer element reduces a drain to source voltage of the power switch to substantially zero in response to the turn on of the clamp switch.

11. The power converter of claim 9, wherein the leakage inductance and the magnetizing inductance of the energy transfer element reduce a drain to source voltage of the power switch to substantially zero in response to the turn on of the clamp switch.

12. The power converter of claim 8, wherein the clamp driver comprises:
 a low side driver configured to receive the clamp drive signal, the low side driver configured to communicate the turn on of the clamp switch; and
 a high side driver coupled to the clamp switch, the high side driver configured to generate a clamp enable signal to control the clamp switch.

13. The power converter of claim 8, wherein the power converter further comprises a secondary controller configured to generate the request signal in response to a feedback signal representative of the output of the power converter.

14. The power converter of claim 13, wherein the secondary controller is galvanically isolated from the primary controller.

15. The power converter of claim 7, wherein the control circuit further comprises:
 an enable circuit configured to generate an enable signal in response to the request signal; and
 a monostable multivibrator configured to generate the clamp drive signal to turn on the clamp switch in response to the enable signal, the monostable multivibrator further configured to output a pulse for a first duration, wherein the first duration begins near an end of an off time of the power switch in response to a determination to turn on the power switch.

16. The power converter of claim 15, wherein the control circuit further comprises a flip flop coupled to the monostable multivibrator, wherein the flip flop generates a first logic state in response to the clamp drive signal.

17. The power converter of claim 16, wherein the control circuit further comprises a delay circuit configured to delay turning on the power switch to provide sufficient time for a parasitic capacitance of the power switch to be discharged into the energy transfer element before the power switch is turned on.

18. The power converter of claim 17, wherein the delay circuit comprises:
 a first switch configured to be controlled by the first mode of operation signal;
 a first delay circuit configured to output the control signal after the first delay time;
 a second switch configured to be controlled by the second mode of operation signal; and
 a second delay circuit configured to output the control signal after the second delay time.

19. A power converter, comprising:
 an energy transfer element coupled between an input of the power converter and an output of the power converter;
 a power switch coupled to the energy transfer element;
 a clamp driver coupled to control a clamp switch; and
 a controller configured to control the power switch to transfer energy from the input of the power converter to the output of the power converter, the controller configured to generate a control signal in response to a request signal representative of the output of the power converter, the control signal is representative of a delay time between turning OFF the clamp switch and turning ON the power switch, wherein the delay time is a first duration in response to a first mode of operation signal representative of a continuous conduction mode (CCM) operation and the delay time is a second duration in response to a second mode of operation signal representative of a discontinuous conduction mode (DCM) operation, wherein the first duration is shorter than the second duration, wherein the controller comprises:
 a first comparator configured to determine if an input line voltage sense signal representative of an input voltage of the power converter is less than a CCM threshold;
 a second comparator configured to determine if the input line voltage sense signal is greater than a DCM threshold;
 a set-reset (SR) latch having a set input coupled to an output of the first comparator, the SR latch further having a reset input coupled to an output of the second comparator, wherein the SR latch is configured to output the first mode of operation signal and the second mode of operation signal; and
 a drive circuit configured to generate a drive signal to control the power switch to transfer energy from the input of the power converter to the output of the power converter in response to the control signal.

* * * * *